(12) United States Patent
Shimizu et al.

(10) Patent No.: US 11,152,353 B2
(45) Date of Patent: Oct. 19, 2021

(54) SEMICONDUCTOR DEVICE AND METHOD OF MANUFACTURING THE SAME

(71) Applicant: RENESAS ELECTRONICS CORPORATION, Tokyo (JP)

(72) Inventors: Fujio Shimizu, Tokyo (JP); Tsuyoshi Kachi, Ibaraki (JP); Yoshinori Yoshida, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/851,978

(22) Filed: Apr. 17, 2020

(65) Prior Publication Data

US 2020/0402972 A1     Dec. 24, 2020

(30) Foreign Application Priority Data

Jun. 18, 2019   (JP) .............................. JP2019-113133

(51) Int. Cl.
*H01L 27/02*    (2006.01)
*H01L 29/78*    (2006.01)
*H01L 21/8234*  (2006.01)
*H01L 27/06*    (2006.01)
*H01L 21/762*   (2006.01)
*H01L 29/06*    (2006.01)

(52) U.S. Cl.
CPC .... *H01L 27/0288* (2013.01); *H01L 21/76224* (2013.01); *H01L 21/823481* (2013.01); *H01L 27/0629* (2013.01); *H01L 29/7813* (2013.01); *H01L 29/0653* (2013.01); *H01L 29/0696* (2013.01)

(58) Field of Classification Search
CPC ........... H01L 27/0288; H01L 21/76224; H01L 21/823481; H01L 29/7813; H01L 27/02629; H01L 29/0653; H01L 29/0696
USPC .......................... 257/363, 360; 438/171, 210
See application file for complete search history.

(56) References Cited

U.S. PATENT DOCUMENTS 10,164,087 B2   12/2018  Nagase et al.
2016/0104773 A1*  4/2016  Kelkar et al. ....... H01L 29/0865

FOREIGN PATENT DOCUMENTS

JP          2017-143188 A       8/2017

* cited by examiner

*Primary Examiner* — Thinh T Nguyen
(74) *Attorney, Agent, or Firm* — McDermott Will & Emery LLP

(57) ABSTRACT

A semiconductor device with an insulated-gate field-effect transistor and its manufacturing method. The cell region EFR defined in the first region of one main surface side of semiconductor substrate (SUB), an insulated gate-type field-effect transistor (MFET) is formed, the gate pad region GPR defined in the first region, snubber circuit SNC is formed snubber region SNR is defined. Within the first and second regions, first and second deep trenches spaced apart from each other are formed, and at least one width of the plurality of second deep trenches formed in the second region is smaller than that of the first deep trench formed in the first region.

4 Claims, 19 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2019-113133 filed on Jun. 18, 2019 including the specification, drawings and abstract is incorporated herein by reference in its entirety.

BACKGROUND

The present invention relates to semiconductor device and method of manufacturing the same and is suitably available for semiconductor device with, for example, a trench gate-type power MOSFET.

An insulated gate field-effect transistor, such as a trench-gate power MOSFET (Metal Oxide Semiconductor Field Effect Transistor, is known as a power-switching semiconductor device.

In this type of semiconductor device, when a parasitic diode having an insulated-gate field-effect transistor is recovered, the parasitic inductance of the circuit in semiconductor device may cause a surge voltage between the source electrode and the drain electrode. Further, when the insulated gate field effect transistor operates from on to off, the parasitic inductance, between the source electrode and the drain electrode, there is a surge voltage is generated. The surge voltage can cause breakdown of insulated gate field effect transistors or other semiconductor devices.

To reduce such surge voltages, snubber circuits are provided in semiconductor device. The snubber circuit consists of resistors and capacitors connected in series. The resistors and capacitors connected in series are electrically connected between the drain and source electrodes of the trench gate type power MOSFET.

[Patent Document 1] Japanese Unexamined Patent Application Publication No. 2017-143188

Patent Document 1 discloses a semiconductor device with snubber circuits having resistors and capacitors are formed in the snubber regions specified in semiconductor substrate.

SUMMARY

An object of the embodiment is to increase the reliability of semiconductor device with an insulated-gate field-effect transistor.

Other objects and novel features will become apparent from the description of this invention and the accompanying drawings.

The semiconductor device according to the embodiment includes a semiconductor substrate, an insulated gate-type field-effect transistor formed in the first region of semiconductor substrate, and a snubber circuit formed in the second region other than the first region, and having a resistor and a capacitor. The semiconductor device, in a plane view of the first main surface side of the first region has a plurality of first deep trenches arranged in an island shape spaced apart from each other. The semiconductor device, in a plane view of the first main surface side of the second area has a plurality of second deep trenches arranged in an island shape spaced apart from each other. Here, in a plane view of the first major surface side of the first region, the width of at least one of the plurality of second deep trenches is smaller than the width of at least one of the plurality of first deep trenches.

The manufacturing method of semiconductor device according to the embodiment includes the following steps. The step for preparing a semiconductor substrate having a second main surface opposite to the first main surface and the first main surface. The step for forming an insulated gate-type field-effect transistor in the first region of semiconductor substrate, forming a snubber circuit having a resistor and a capacitor in the second region other than the first region. The step for forming a plurality of first deep trenches arranged in an island shape spaced apart from each other. In the first region, toward the substrate from the first main surface, the step for forming a plurality of second deep trenches arranged in an island shape spaced apart from each other in the second region toward the substrate from the first main surface. Here, at least one width of the plurality of second deep trenches arranged in an island shape spaced apart from each other toward the substrate from the first main surface of the first region is smaller than the width of the plurality of first deep trenches.

According to semiconductor device according to the embodiment, it is possible to increase the reliability of semiconductor device with an insulated gate-type field-effect transistor.

According to manufacturing method of according to semiconductor device of another embodiment, it is possible to increase the reliability of semiconductor device with an insulated gate-type field-effect transistor.

DETAILED DESCRIPTION

Figure 1:
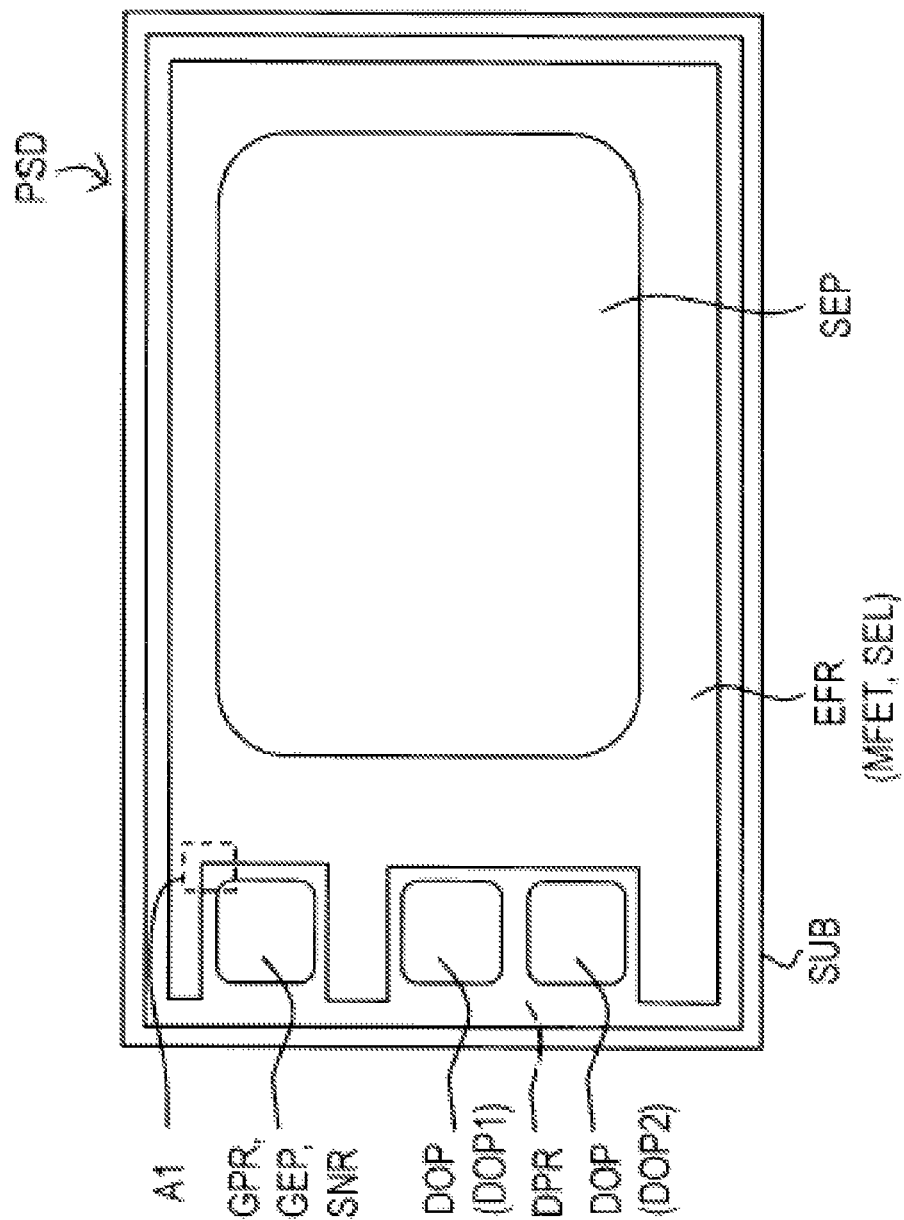
FIG. 1 is a plane view showing planar patterns of semiconductor device in first embodiment according to tip states.

Hereinafter, according to semiconductor device of the embodiment will be described in detail with reference to the drawings. In the specification and the drawings, the same or corresponding form elements are denoted by the same reference numerals, and a repetitive description thereof is omitted. In the drawings, for convenience of description, the configuration may be omitted or simplified. Also, at least some of the embodiments and each modification may be arbitrarily combined with each other.

First Embodiment

Semiconductor device of first embodiment is described below with reference to the drawings.

FIG. 1 shows plane view of semiconductor device according to present embodiment. In semiconductor device PSD of FIG. 1 (semiconductor chip), it has a first major surface and the second major surface opposite. FIG. 1 is a plane view as viewed from the first principal surface side. On the first major surface side of semiconductor substrate SUB, for example, the gate pad area GPR and the diode pad area DPR are defined along the edge side of semiconductor device PSD (semiconductor chip). In the gate pad region GPR, snubber region SNR is formed. Further, for example, the gate pad region GPR, and semiconductor device PSD other than the diode pad region DPR (semiconductor chip) cell area EFR is defined, the insulated gate field-effect transistor MFET of semiconductor device PSD (semiconductor chip) is formed.

In the gate pad region GPR, the gate pad GEP is formed. The gate pad GEP is electrically connected to the gate electrode MFET of the insulated gate field-effect transistor. The gate pad GEP is used for electrical connection to the outside.

In the diode pad region DPR, the diode pad DOP is formed. A temperature sensing diode (not shown) is formed in the diode pad area DPR as an element for detecting the temperature of semiconductor device, for example. The diode pad DOP1 is electrically connected to the anode of the temperature-sensing diode. The diode pad DOP2 is also electrically connected to the cathode of the temperature-sensing diode. The diode pad DOP, which includes a diode pad DOP1 and a diode pad DOP2, is used for external electrical connections.

A source electrode SEL is formed so as to cover the cell region EFR. The source-electrode SELs are electrically connected to the sources of the insulated-gate field-effect transistor MFET. To cover the source electrode SEL or the like, passivation film (not shown) is formed. The passivation film has, for example, an opening that exposes the source electrode SEL. The exposed source electrode SEL is used as the source pad SEP for electrical connection to the outside.

Figure 2:
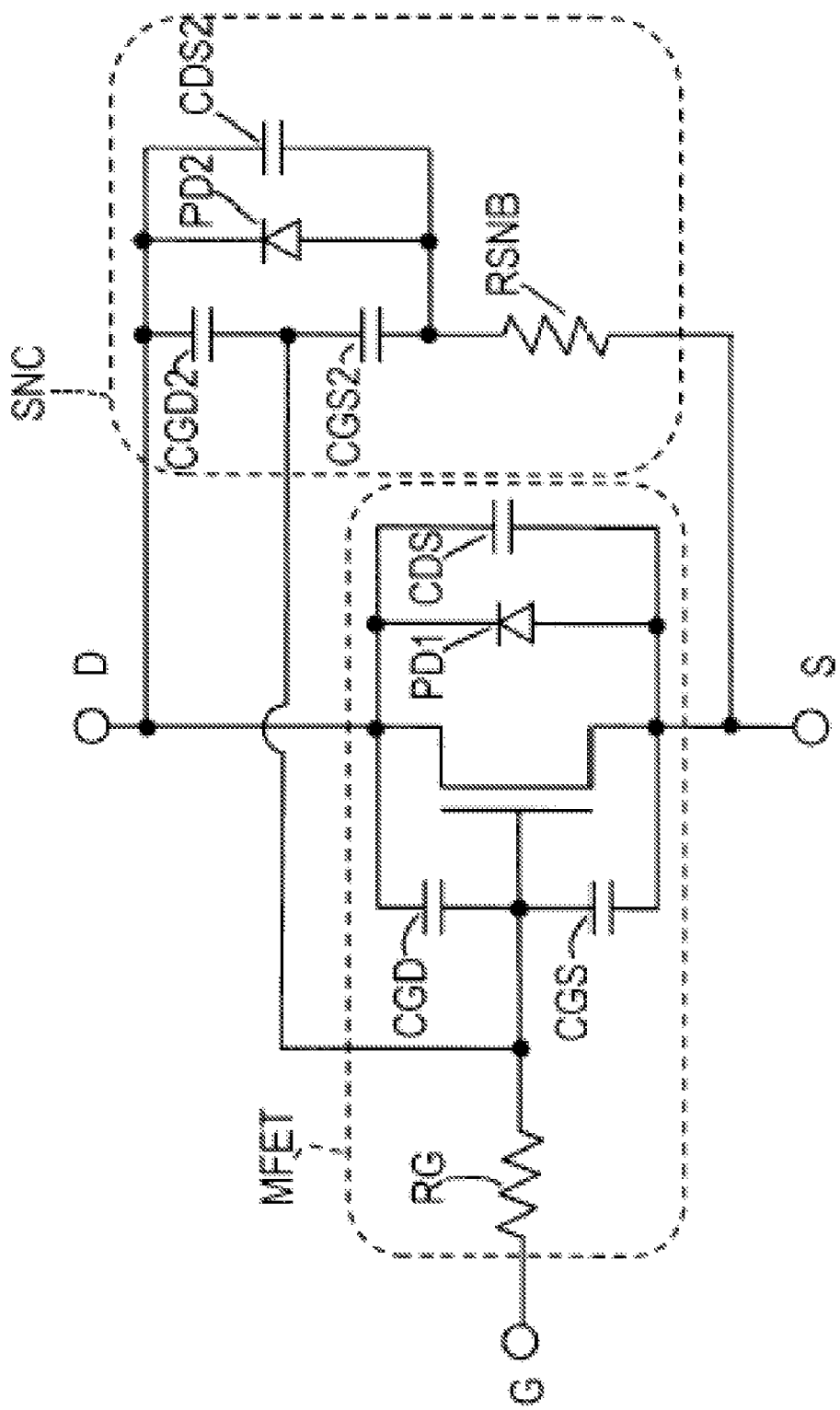
FIG. 2 is an equivalent schematic of a first embodiment according to insulated-gate field-effect transistor and snubber circuit.

Next, an equivalent circuit of the snubber circuit and the insulated gate type field effect transistor. As shown in FIG. 2, the snubber circuit SNC is electrically connected in parallel between the source S and the drain D of the insulated gate-type field-effect transistor MFET. The insulated gate-type field-effect transistor MFET has a capacitor CDS, capacitor CGD and capacitor CGS as a parasitic capacitor, and a diode PD1 as a diode of the parasitic.

The capacitor CDS is the parasitic capacitor between the drain D and the source S. The capacitor CGD is the parasitic capacitor between gate G and drain D. The capacitor CGS is the parasitic capacitor between the gate G and the source S. The diode PD1 is a parasitic diode between source S and drain D. The resistance RG is the resistance of the gate G.

The snubber circuits SNCs have resistor RSNB, capacitor CDS2, capacitor CGD2 and capacitor CGS2. The snubber circuit SNC is formed by a second embedded insulator ZOF2 and a trench gate electrode TGEL disposed below the gate pad GEP. CDS2 is the parasitic capacitor between the drain D and the source S. The capacitor CGD2 is the parasitic capacitor between the gate G and the drain D. The capacitor CGS2 is the parasitic capacitor between the gate G and the drain D. The diode PD2 is a parasitic diode between source S and drain D.

Next, the structure around the snubber circuit SNC and the snubber circuit SNC will be described with reference to FIGS. 3 to 5. For the structure in the broken-line square frame A1 shown in FIG. 1, FIG. 3 shows an example in a planar pattern, FIG. 4 shows an example in a cross-sectional perspective view, FIG. 5 shows an example in cross-sectional view.

Figure 3:
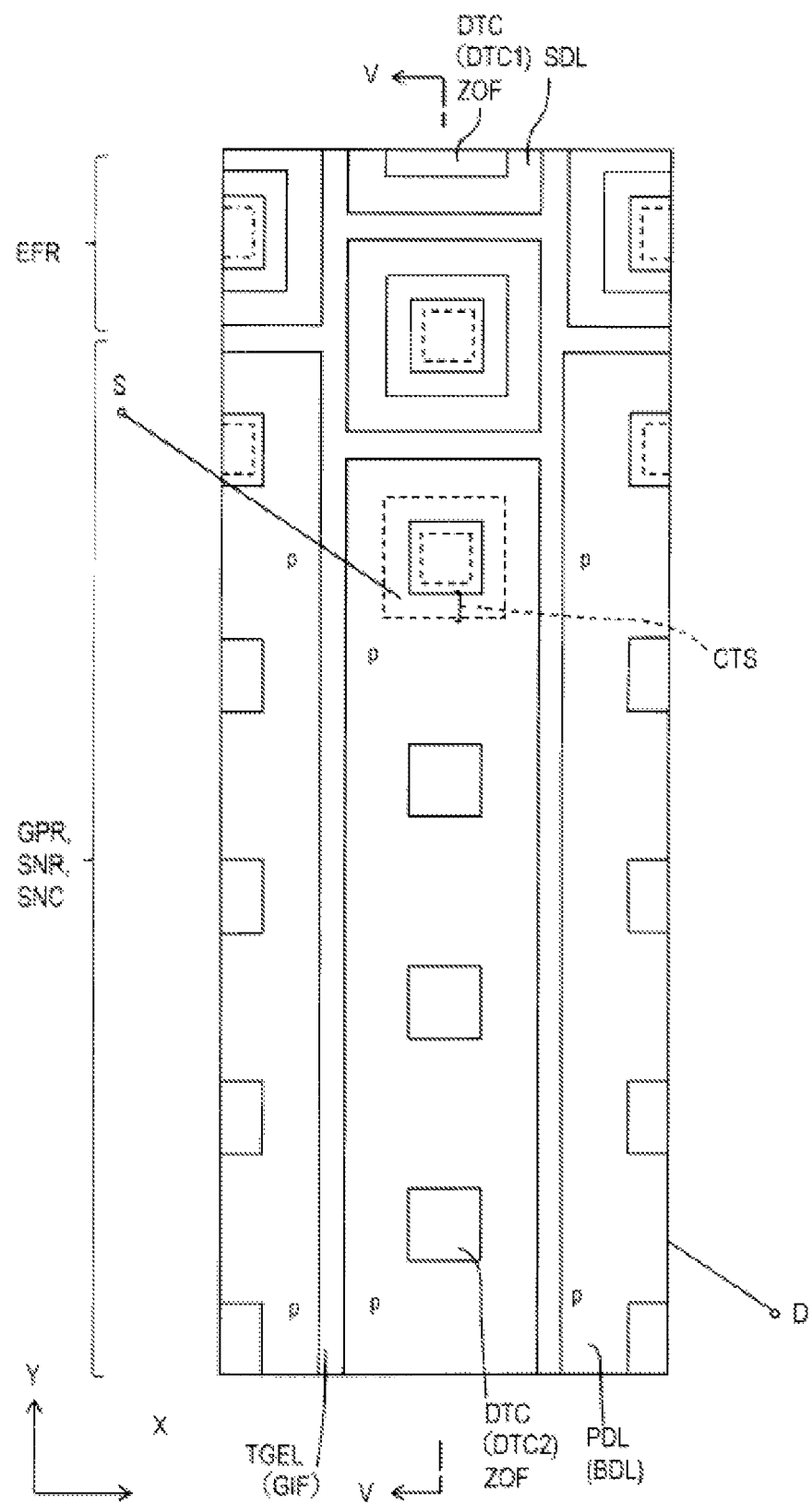
FIG. 3 is a plane view showing a planar pattern in the frame A1 shown in FIG. 1 according to first embodiment.
Figure 4:
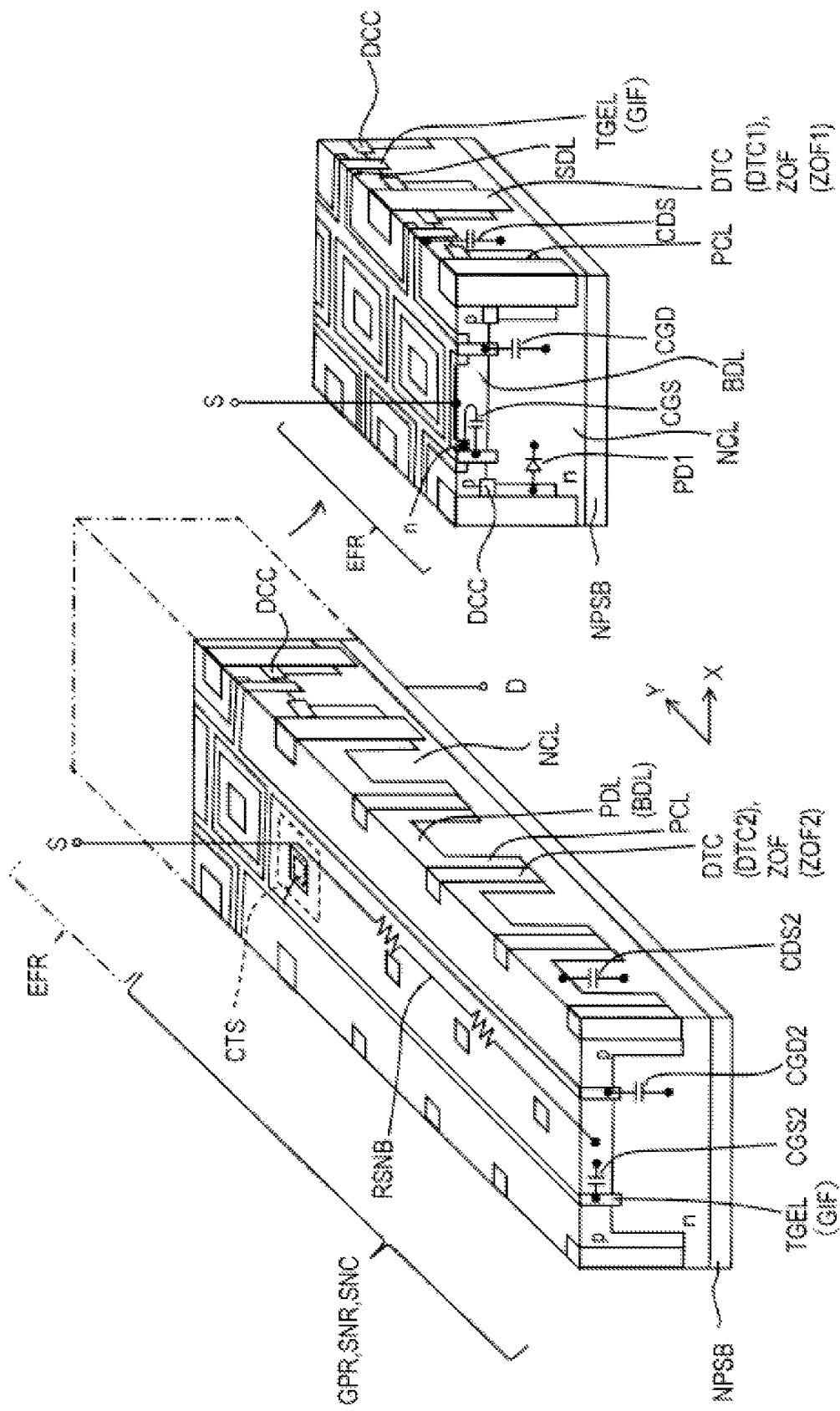
FIG. 4 is a cross-sectional inclined view showing the structures in the frame A1 shown in FIG. 1 according to first embodiment.
Figure 5:
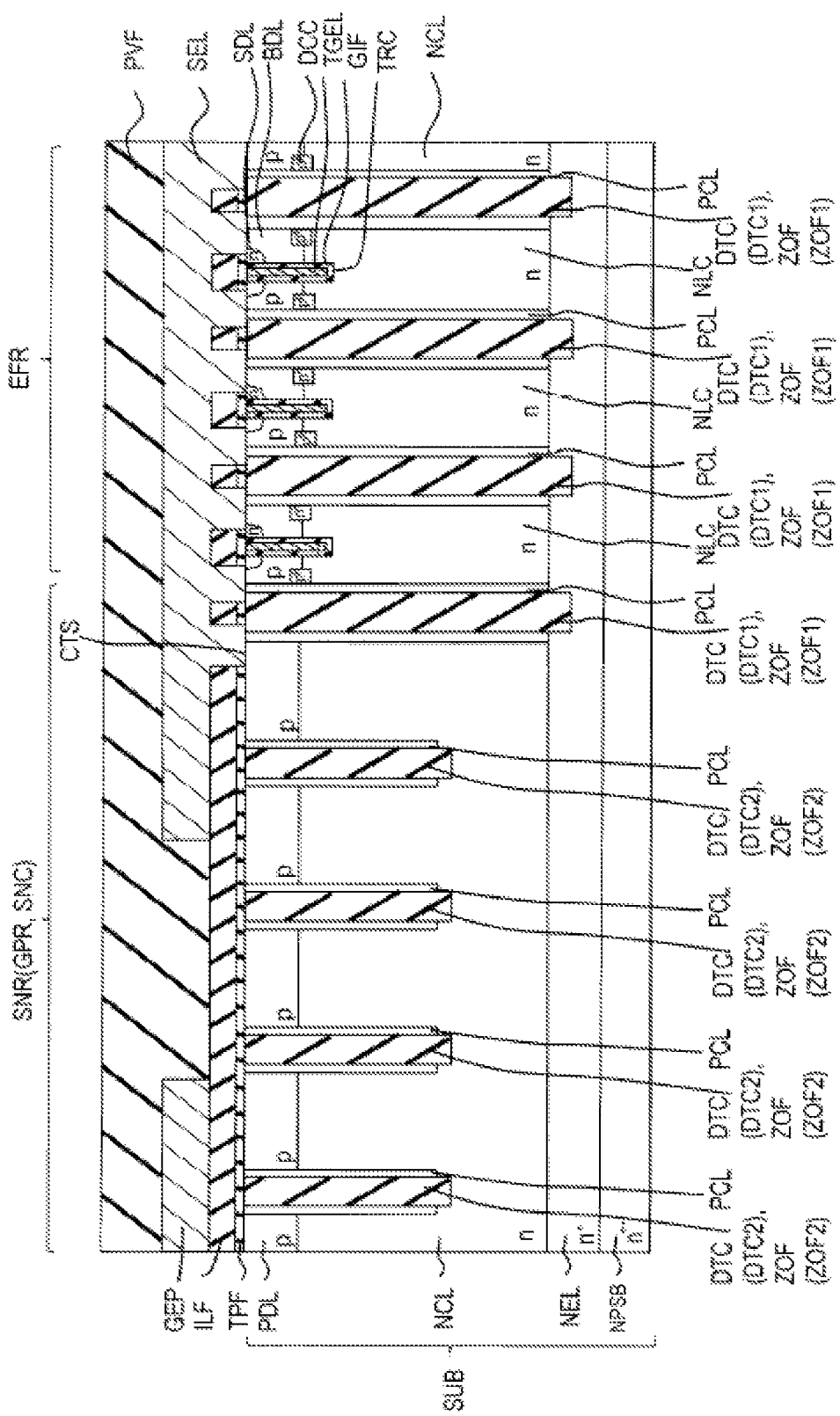
FIG. 5 is a cross-sectional view in the cross-sectional line V-V shown in FIG. 3 according to first embodiment.

As shown in FIGS. 3 to 5, on the side of one main surface of semiconductor substrate SUB (first main surface), snubber region SNR and cell area EFR are defined, respectively. The snubber region SNR is defined in the gate pad region GPR. As shown in FIG. 4, in the snubber region SNR, p-type diffusion layer PDL is configured as a resistive element. Further, the p-type diffusion layer PDL and the n-type column layer NCL is configured as a capacitive element. Furthermore, in FIGS. 4 and 5, on the side of the other main surface of semiconductor substrate SUB (second main surface), n-type substrate NPSB (n-type epitaxial layer NEL) is disposed. The n-type substrate NPSB is electrically connected to the drain electrodes (not shown).

In the cell area EFR, over a predetermined depth from one main surface of semiconductor substrate SUB, the base diffusion layer BDL is formed. In the base diffusion layer BDL, the channel of the insulated gate type field effect transistor is formed. An n-type column layer NCL contacting the n-type NPSB reaches a predetermined depth from the bottom of the base diffusion layer BDL is formed.

A trench gate electrode TGEL extending from one major surface of semiconductor substrate SUB through the base diffusion layer BDL to the n-type column layer NCL is formed. The trench gate electrode TGEL, in the gate trench TRC, is formed by interposing the gate insulating film GIF. The trench gate electrode TGEL is arranged in a mesh-like shape.

The base diffusion layer BDL, over a shallower region than the bottom of the base diffusion layer BDL from one main surface of semiconductor substrate SUB, n-type source diffusion layer SDL is formed. The source diffusion layer SDL is formed by interposing a gate insulating film GIF on the side of the trench gate electrode TGEL. Towards the n-type substrate NPSB from one main surface of semiconductor substrate SUB, a plurality of buried insulator ZOF is formed. The cell region EFR is a first region, the first embedded insulator ZOF1 is formed, the snubber region SNR is a second region, the second insulator ZOF2 is formed. The first buried insulator ZOF1 is formed in the first deep trench DTC1 and the second insulator ZOF2 is formed in the second deep trench DTC2.

The first deep trench DTC1 and the second deep trench DTC2 are, for example, arranged in island shape at a distance from each other. The first deep trench DTC1 is formed in a region surrounded by a trench gate electrode TGEL arranged in a mesh shape in a plane view. Further, as shown in FIG. 4, the first deep trench DTC1 is formed so as to contact the p-type column layer PCL and the p+ diffusion layer DCC.

The second deep trench DTC2 is formed along a trench gate electrode TGEL extending in stripes spaced apart from each other in the Y-axis direction in a plane view. The second embedded insulator ZOF2 is formed so as to contact the p-type column layer PCL. Note that the Y-axis direction, in a plane view, a direction along the longitudinal direction of the trench gate electrode TGEL formed in the snubber region SNR. The X-axis direction, in a plane view, a direction along the shorter direction of the trench gate electrode TGEL formed in the snubber region SNR. In a plane view, the X-axis and Y-axis are orthogonal each other.

Also, at least one width of the plurality of second deep trench DTC2 in a plane view is smaller than at least one width of the plurality of first deep trench DTC1. In addition, at least one depth of the first deep trench DTC1 in the board orientation is shallower than at least one of the second deep trench DTC2.

For example, the opening size of the second deep trench DTC2 is smaller than the opening size of first deep trench DTC1 in a plane view. For example, the width of the first deep trench DTC1 (opening width) is 0.7 µm or more in a plane view, the width of the second deep trench DTC2 is 0.5 µm or more and less than 0.7 µm in a plane view. Further, for example, the depth in the substrate direction of the first deep trench DTC1 is 8 µm or more, the depth in the substrate direction of the second deep trench DTC2 is 6 µm or more and less than 8 µm. Here, the opening width, in a plane view, among a plurality of sides constituting the opening, the maximum value of the spacing of the two sides facing each other. The depth is the largest spacing in the thickness direction between the bottom surface of the deep trench DTC and upper surface of the embedded insulator ZOF embedded in the deep trench DTC.

The p-type column layer PCL also contacts the n-type column layer NCL. The p-type column layer PCL and the n-type column layer NCL are alternately arranged as a super junction structure.

The p+ diffusion layer DCC is formed in contact with the buried insulator ZOF, but a base diffusion layer BDL, is formed in contact with the n-type column layer NCL. The p+ diffusion layer DCC is formed in the cell region EFR to increase the inductive load tolerance of the cell region EFR.

A parasitic capacitor CDS is formed by the source diffusion layer SDL and the n-type column layer NCL. A parasitic capacitor CGD is formed by the trench-gate electrode TGEL and the n-type column layer NCL. A parasitic diode PD1 is formed by the trench-gate electrode TGEL and the source diffusion layer SDL.

In the snubber region SNR, a p-type diffusion layer PDL is formed over a predetermined depth from one main surface of semiconductor substrate SUB. An n-type column layer NCL reaching a predetermined depth from the bottom of the p-type diffusion layer PDL to the n-type epitaxial layer NEL is formed.

A trench gate electrode TGEL that penetrates the p-type diffusion layer PDL from one main surface of semiconductor substrate SUB to the n-type column layer NCL is formed. The trench gate electrode TGEL is formed by interposing the gate insulating film GIF in the gate trench TRC. In the snubber region SNR, the trench gate electrode TGEL is formed in stripes at intervals in the Y-axis direction. On the other hand, in the cell area EFR, the trench gate electrode TGEL extends in the Y-axis direction, and is formed in a mesh shape spaced apart from each other in the X-axis direction intersecting the Y-axis direction.

By the p-type diffusion layer PDL located between the trench gate electrode TGEL and the other trench gate electrode TGEL, the resistor RSNB of the snubber circuit SNC is formed. The resistor RSNB extends in the Y-axis direction, for example. At the end of the cell area EFR-side in the resistor RSNB, a contact CTS which is electrically connected to the source electrode SEL (source S) is provided. For example, the resistance of the resistor RSNB can be adjusted by the length of the p-type diffused-layer PDL from the contact CTS starting from the contact CTS.

Below the p-type diffusion layer PDL, n-type column layer NCL is located so as to bonding to the p-type diffusion layer PDL. A parasitic capacitor CDS2 is formed by the p-type diffusion layer PDL and the n-type column layer NCL. The capacitance of the capacitor CDS2 of the parasitic depends on the reverse bias (voltage) applied to the drain. Further, for example, by the dimension (length in the X and Y directions) of the p-type diffusion layer PDL (p-type column layer PCL), the junction area between the p-type diffusion layer PDL (p-type column layer PCL) and the n-type column layer NCL can be changed to adjust the capacitor CDS2 of the parasitic capacitor. As will be described later, the resistance values of the resistor RSNB and the capacitance of the capacitor CDS2 of the parasitic becomes a key parameter for reducing the surge voltage.

In the region located between the trench gate electrode TGEL and the other trench gate electrode TGEL, a plurality of buried insulator ZOF is disposed islands distance apart from each other in the Y-axis direction. A plurality of buried insulators ZOF are formed in a deep trench DTC from one major surface of semiconductor substrate SUB through the p-type diffusion layer PDL and the n-type column layer NCL to the n-type epitaxial layer NEL. A p-type column layer PCL is formed so as to contact the buried insulator ZOF, the n-type column layer NCL, and the p+-type diffusion layer DCC, respectively.

A parasitic capacitor CGD2 is formed by the trench gate electrode TGEL and the n-type column layer NCL. A parasitic capacitor CGS2 is formed by the trench gate electrode TGEL and the p-type diffusion layer PDL. The p-type diffusion layer PDL of the snubber region SNR and the base diffusion layer BDL of the cell region FER, for example, is partitioned by a trench gate electrode TGEL extending in the X-axis direction.

So as to cover the cell area FER and snubber area SNR, the protective insulating film TPF is formed on the main surface of semiconductor substrate SUB, the interlayer insulating film ILF so as to contact the upper portion of the protective insulating film TPF is formed. A source electrode SEL and the gate pad GEP are formed so as to cover the interlayer insulating film ILF. A source electrode SEL is electrically connected to the source diffusion layer SDL and the base diffusion layer BDL.

Further, the source electrode SEL is electrically connected to the p-type diffusion layer PDL through the contact CTS. A passivation film PVF is formed so as to cover the source electrode SEL and the gate pad GEP. The main parts of semiconductor device are constructed as described above.

Next, an example of manufacturing method of above-described semiconductor device will be described. First, n++-type substrate NPSB, a semiconductor substrate SUB having n-type epitaxial layer NEL and p-type epitaxial layer PEL (see FIG. 7) are prepared.

Next, on one main surface side of semiconductor substrate SUB, a gate trench of a predetermined depth from the surface of the p-type epitaxial layer PEL (not shown) is formed. Next, by performing the thermal oxidation treatment, on the surface of the p-type epitaxial layer PEL including a portion of the p-type epitaxial layer PEL exposed in the gate trench, silicon oxide film (not shown) is formed. A polysilicon film (not shown) is then formed so as to fill the gate trench TRC.

Figure 7:
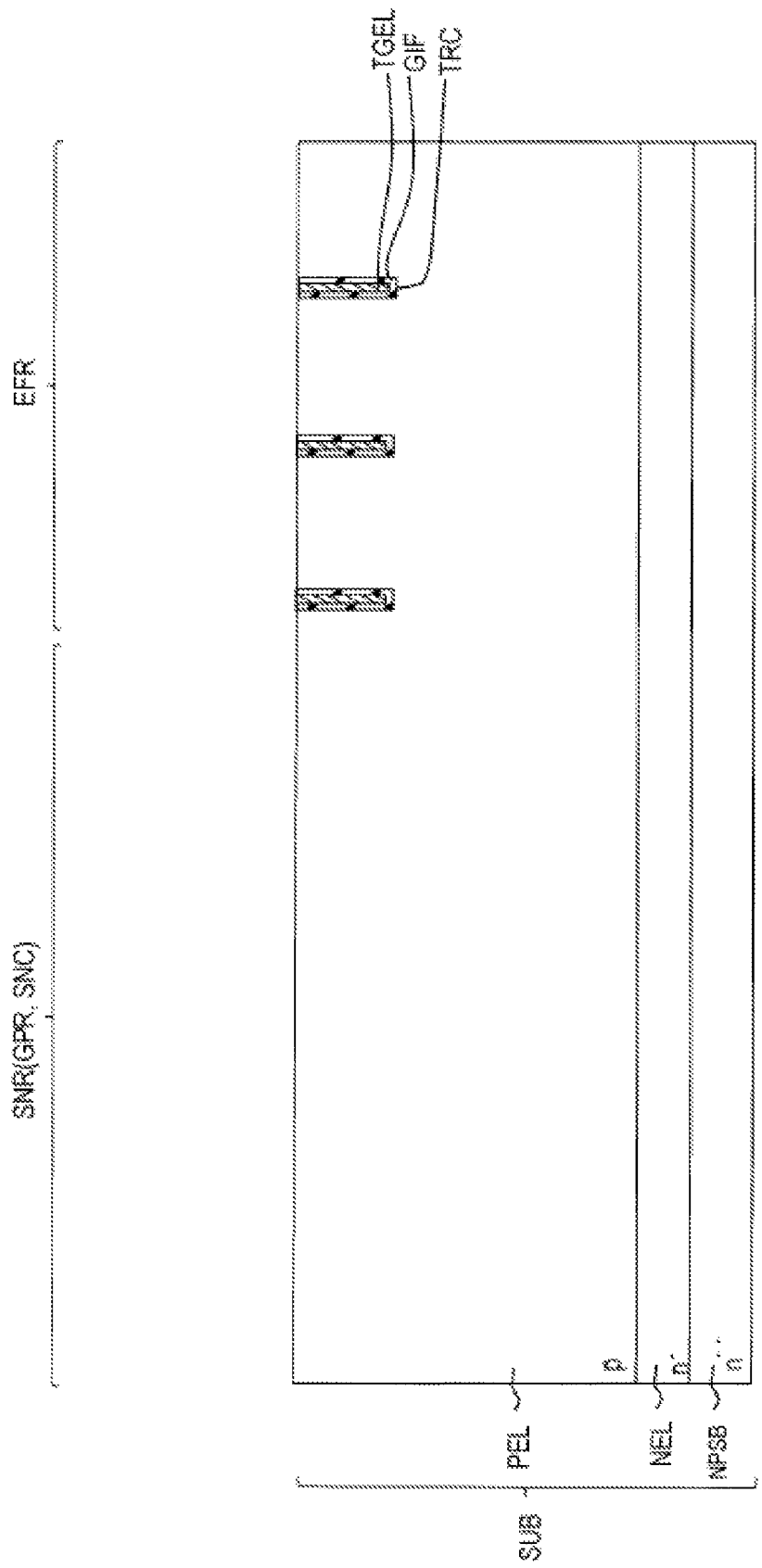
FIG. 7 is a cross-sectional view showing manufacturing method step according to semiconductor device of first embodiment.

Then, portions of the silicon oxide film and the polysilicon film located on upper surface of the p-type epitaxial layer PEL are removed. Thus, as shown in FIG. 7, a portion of the silicon oxide film left in the gate trench TRC is formed as a gate insulating film GIF. Also, portions of the polysilicon film left in the gate trench TRCs are formed as trench gate electrode TGEL. At this time, in the snubber region SNR, the trench gate electrode TGEL, for example, is formed so as to extend in the Y-axis direction (see FIGS. 3 and 4).

Next, by performing the thermal oxidation treatment, on the surface of the p-type epitaxial layer PEL, the protective insulating film IPF (see FIG. 8) is formed. Next, by performing the photolithography process and the etching process, a second deep trench DTC2 is formed in the first deep trench DTC1 and the snubber region SNR in the cell area EFR (refer to FIG. 8). The first deep trench DTC1 and the second deep trench DTC2 are formed in an island shape at a distance from each other. At least one width of the second deep trench DTC2 is less than at least one width of the first deep trench DTC1 in a plane view. Also, at least one depth of the second deep trench DTC2 in the substrate direction is shallower than at least one depth of the deep trench DTC1.

Figure 8:
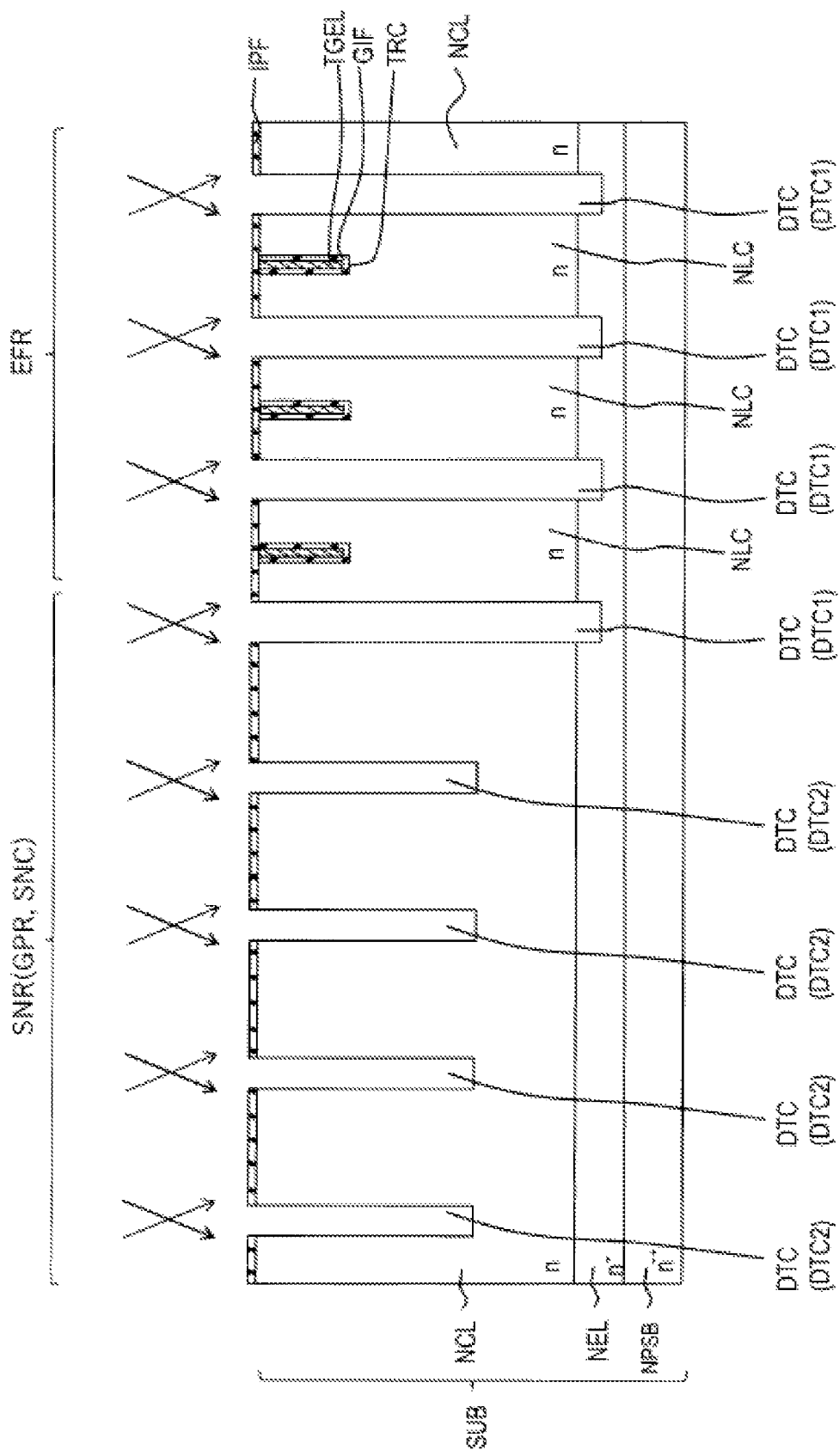
FIG. 8 is a cross-sectional view showing the steps to be performed after the steps shown in FIG. 7 according to first embodiment.
Figure 9:
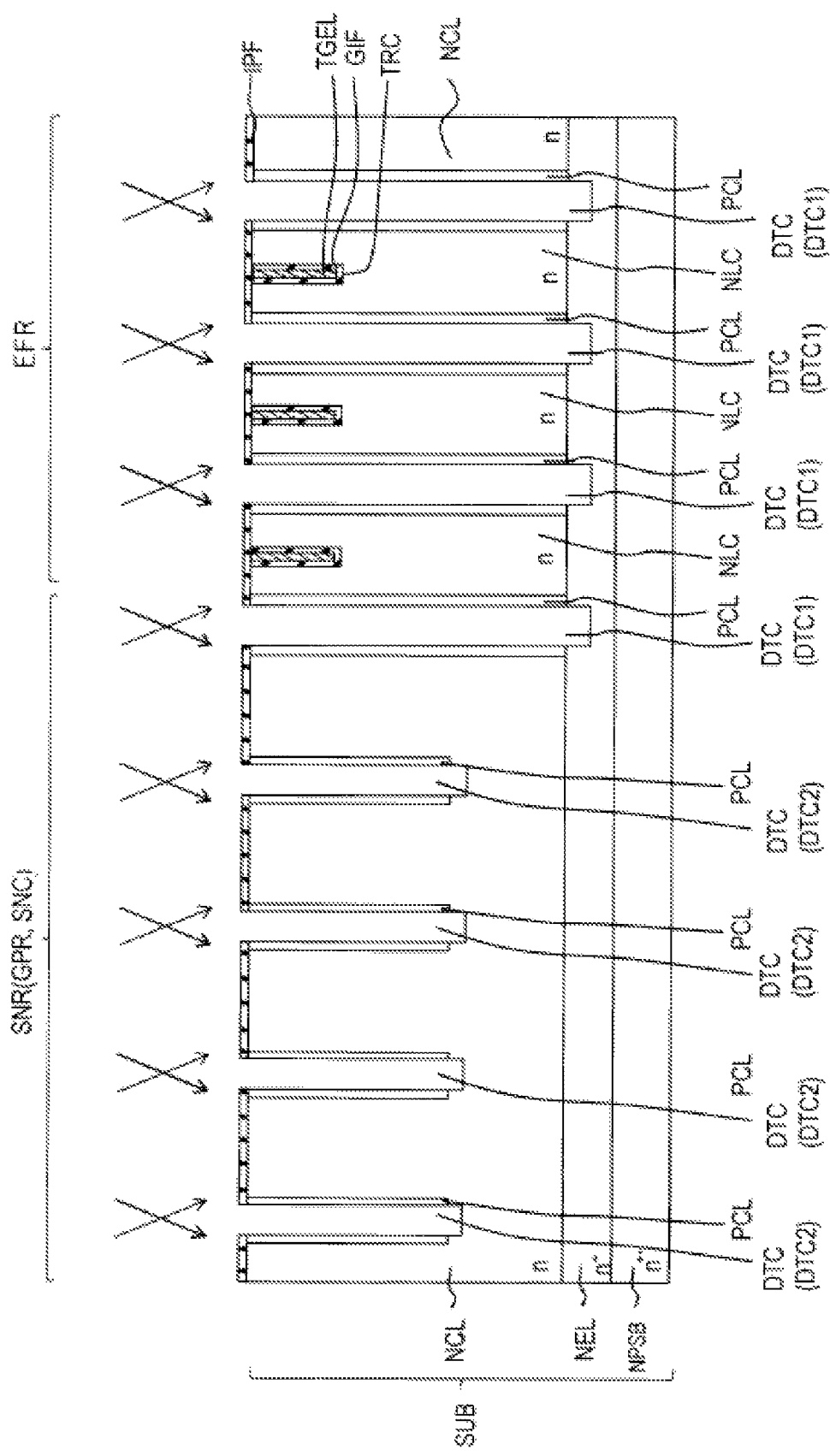
FIG. 9 is a cross-sectional view showing the steps to be performed after the steps shown in FIG. 8 according to first embodiment.

Next, as shown in FIG. 8, through the protective insulating film IPF and deep trench DTC, n-type impurities are obliquely injected. Then, by performing the heat treatment, n-type column layer NCL is formed in each of the cell region EFR and the snubber region SNR. Next, as shown in FIG. 9, via the protective insulating film IPF and deep trench DTC, p-type impurities are injected. Then, by performing the heat treatment, a p-type column layer PCL is formed along the sidewall surface of the deep trench DTC in each of the cell region EFR and snubber region SNR. The p-type column layer PCL will be in contact with the n-type column layer NCL.

Figure 10:
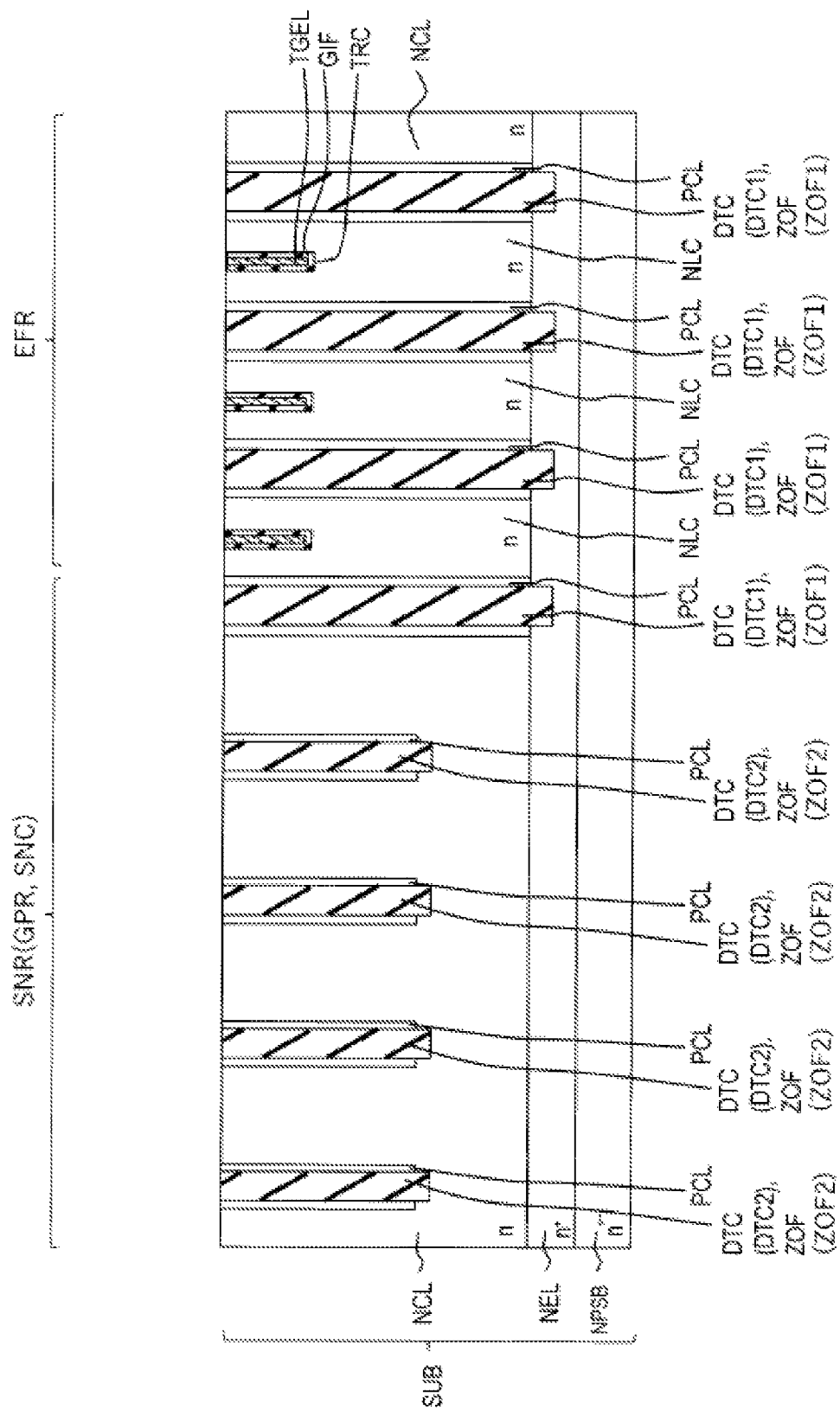
FIG. 10 is a cross-sectional view showing a step performed after the step shown in FIG. 9. according to first embodiment.

A silicon oxide film (not shown), for example, is then formed to embed the deep trench DTC. Next, portions of the silicon oxide film located on upper surface of semiconductor substrate SUBs are removed, leaving portions of the silicon oxide film located in the deep trenches DTCs by, for example, chemical mechanical polishing (chemical Mechanical polishing). Thus, as shown in FIG. 10, a first embedded insulator ZOF1 is formed in the cell area EFR, the second embedded insulator ZOF2 is formed in the snubber area SNR. The second embedded insulator ZOF2 is formed in an island shape spaced apart from each other in the Y-axis direction (see FIGS. 3 and 4). At least one width of the second buried insulator ZOF2 is less than at least one width of the first buried insulator ZOF1 in a plane view. Further, at least one depth in the substrate-direction of the second buried insulator ZOF2 is shallower than at least one depth of the first buried insulator ZOF1.

Figure 11:
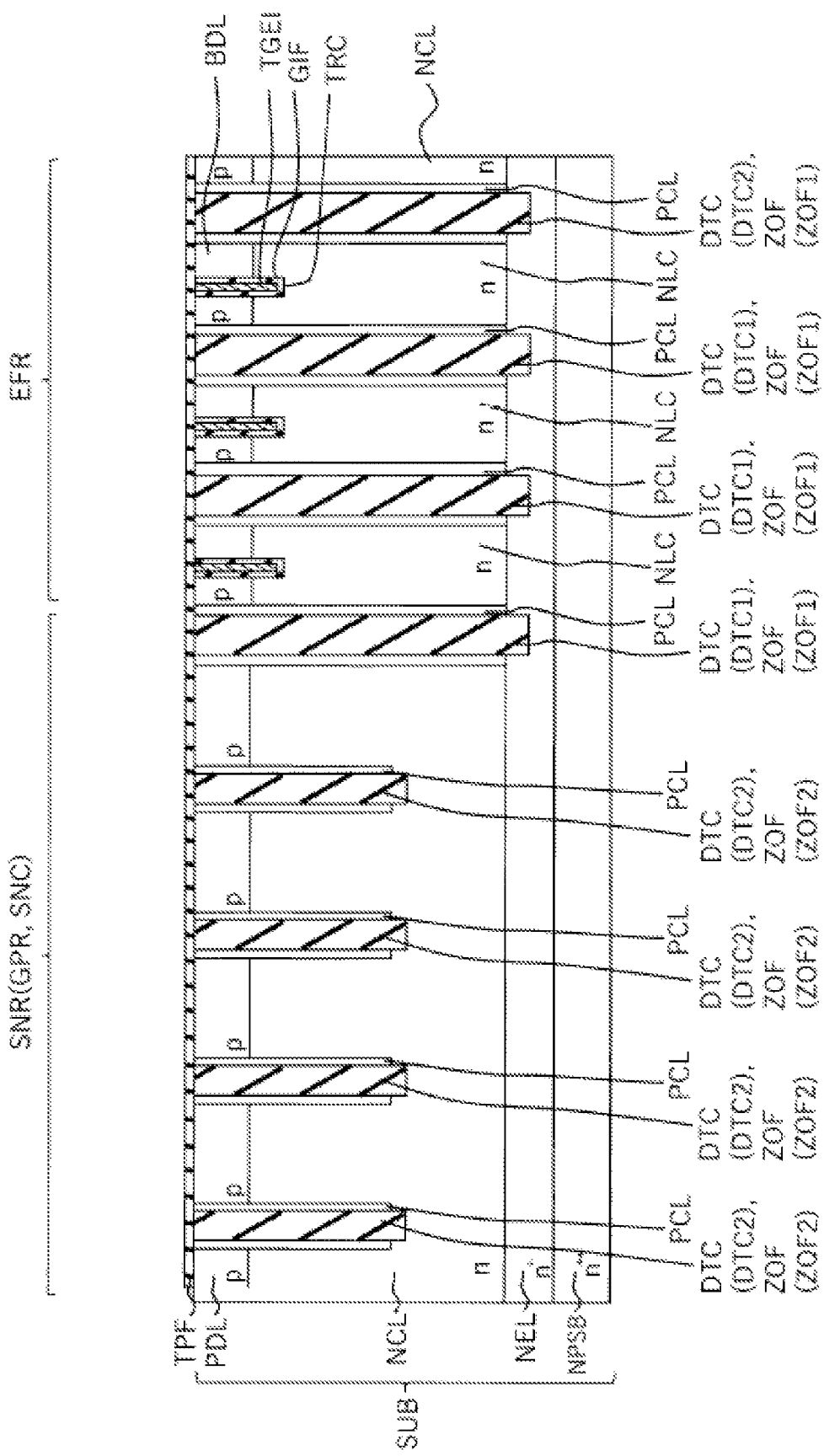
FIG. 11 is a cross-sectional view showing a step performed after the step shown in FIG. 10 according to first embodiment.

Next, for example, subjected to thermal oxidation treatment, by oxidizing the surface of semiconductor substrate SUB, protective insulating film TPF is formed (see FIG. 11). Next, by performing the photolithography process, the photoresist pattern (not shown) is formed to expose the region where the base diffusion layer and the p-type diffusion layer is formed. The photoresist pattern as an injection mask, p-type impurities are injected through the protective insulating film TPF. Thereafter, the photoresist pattern is removed.

Thus, as shown in FIG. 11, in the cell region EFR, p-type base diffusion layer BDL is formed. In the snubber region SNR, p-type diffusion layer PDL is formed. Base diffusion layer BDL and p-type diffusion layer PDL, from the surface of semiconductor substrate SUB, is formed at a position shallower than the position where the trench gate electrode TGEL is formed. Thus, in the snubber region SNR, the n-type column layer NCL and the p-type diffusion layer PDL, which are the resistor and capacitor of the snubber circuit SNC, are formed simultaneously with the n-type column layer NCL and the base diffusion layer BDL formed in the cell region EFR.

Figure 12:
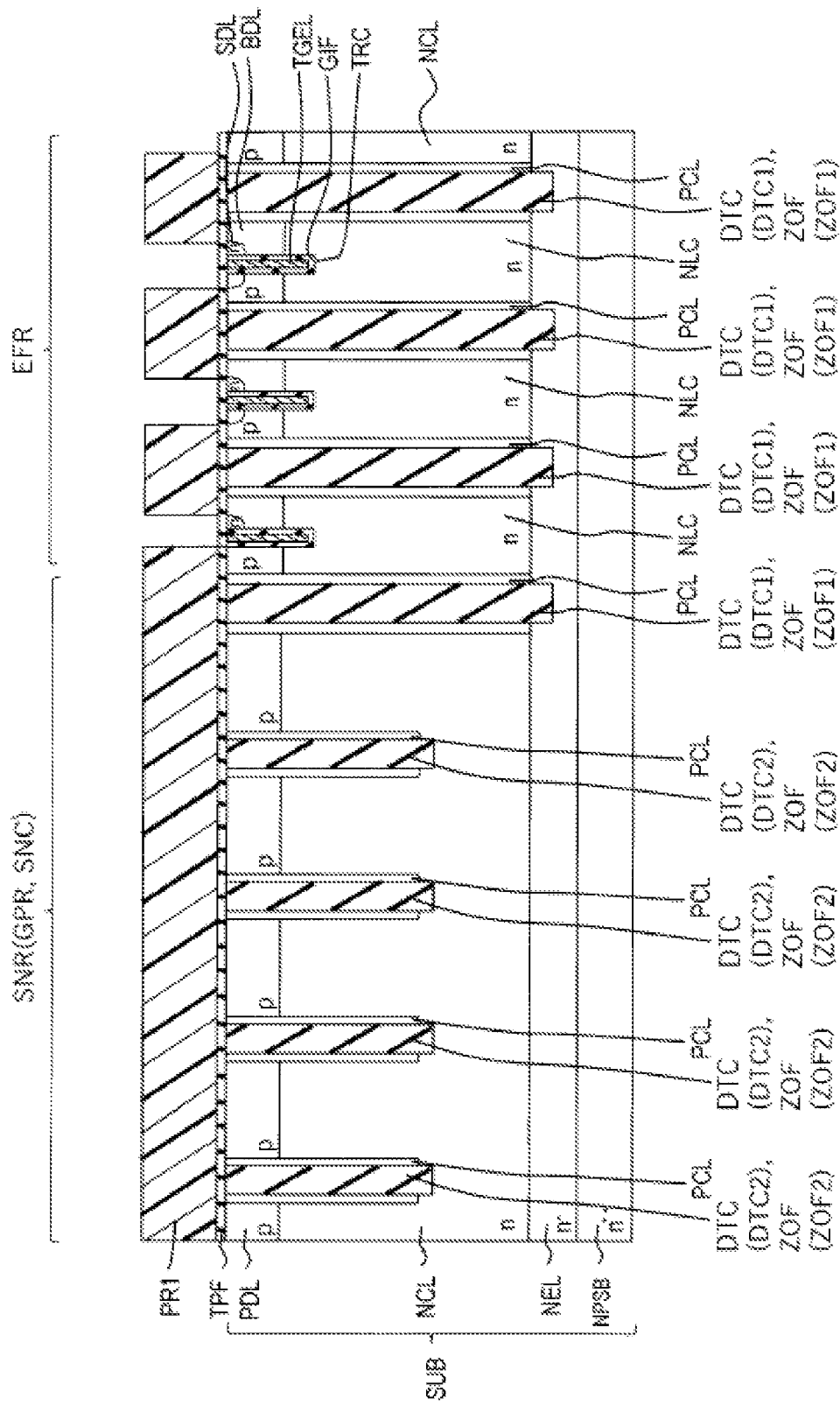
FIG. 12 is a cross-sectional view showing a step performed after the step shown in FIG. 11 according to first embodiment.

Next, as shown in FIG. 12, by performing the photolithography process, with covering the snubber region SNR, the cell region EFR, the photoresist pattern PR1 is formed to expose the region where the source diffusion layer is formed. Next, the photoresist pattern PR1 as an implantation mask, n-type impurities are implanted through the protective insulating film TPF.

Thus, in the cell region EFR, the source diffusion layer SDL is formed. Source diffusion layer SDL, from the surface of the base diffusion layer BDL, is formed at a shallower position than the position of the bottom of the base diffusion layer BDL. Thereafter, the photoresist pattern PR1 is removed.

Figure 13:
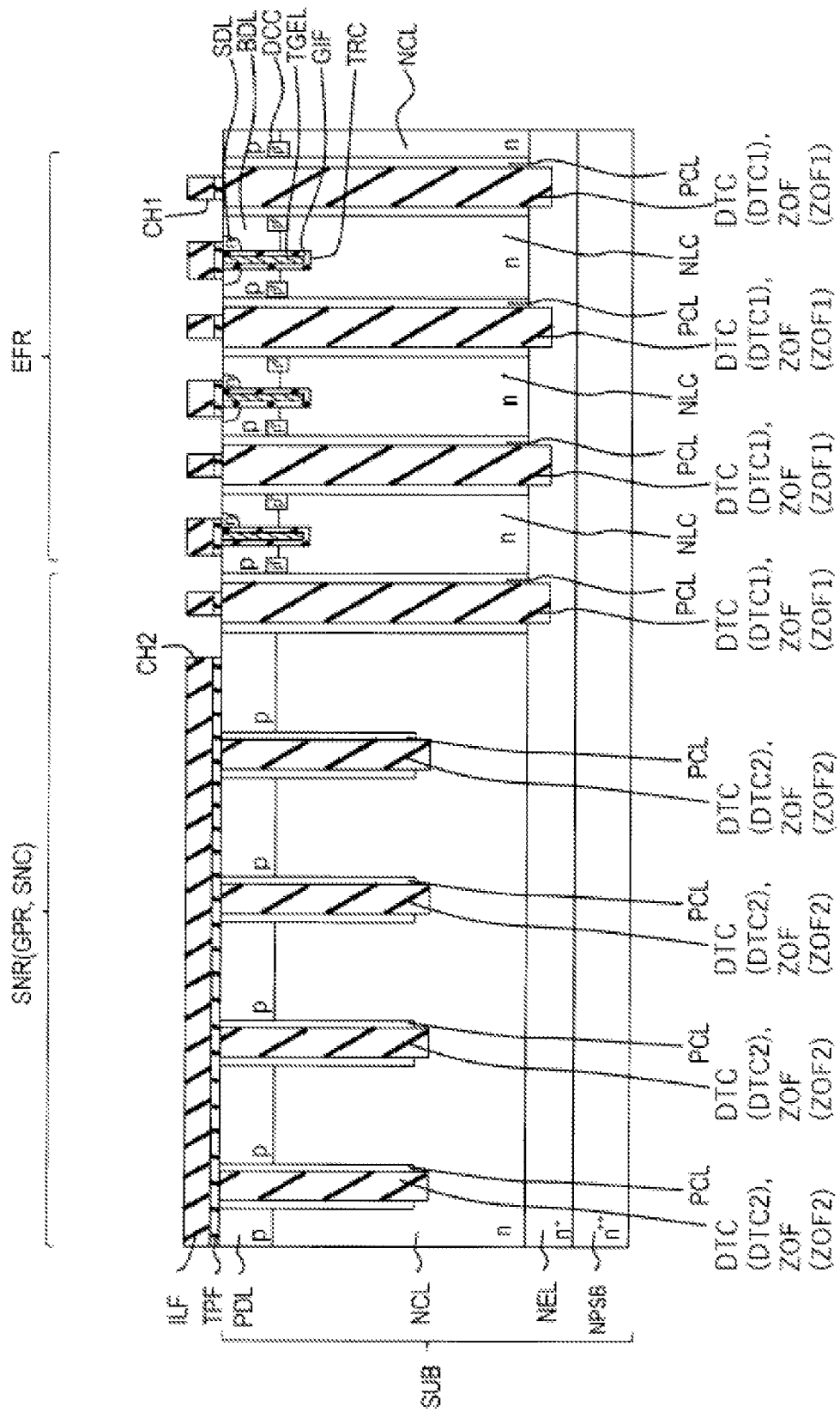
FIG. 13 is a cross-sectional view showing a step performed after the step shown in FIG. 12 according to first embodiment.

Next, as shown in FIG. 13, so as to cover semiconductor substrate SUB (protective insulating film TPF), the interlayer insulating film ILF is formed. Next, the interlayer insulating film ILF, by performing the photolithography process and etching process, as shown in FIG. 13, the cell area EFR, the opening CH1 for exposing the source diffusion layer SDL and the base diffusion layer BDL is formed. Next, by performing ion implantation in the opening CH1 using the interlayer insulating film ILF as a mask, near the border between the base diffusion layer BDL and the n-type column layer NCL, p+ diffusion layer DCC is formed. Incidentally, when forming the opening CH1, in the snubber region SNR, the opening CH2 for exposing the p-type diffusion layer PDL is formed.

Figure 14:
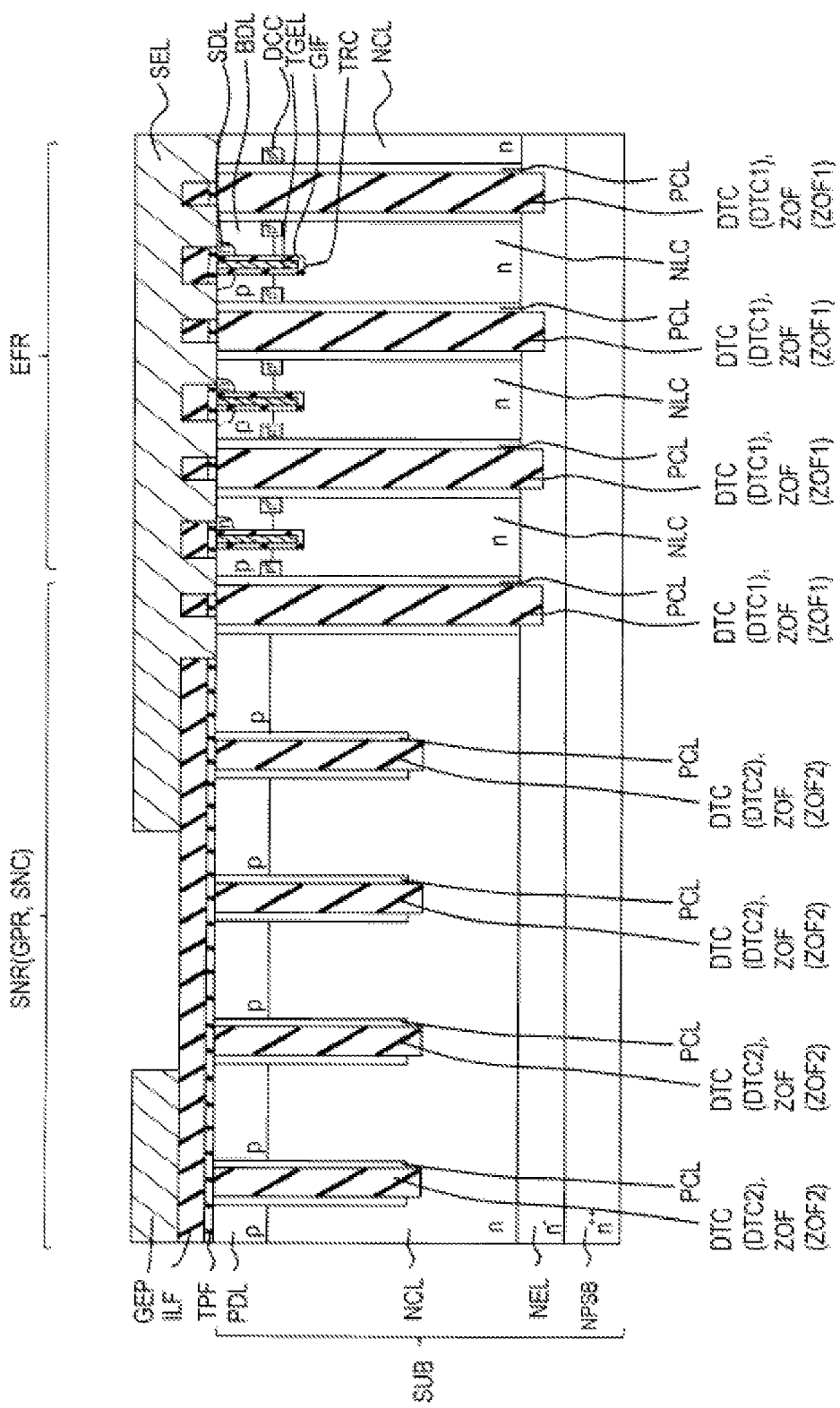
FIG. 14 is a cross-sectional view showing a step performed after the step shown in FIG. 13 according to first embodiment.

Next, for example, by a sputtering method or the like, so as to cover the interlayer insulating film ILF, aluminum film (not shown) is formed. After that, predetermined photolithography processing and etching processing are performed in aluminum film. Thus, as shown in FIG. 14, in the cell region EFR, the source electrode SEL is formed. In the snubber region SNR (gate pad region GPR), the gate pad GEP is formed.

Figure 15:
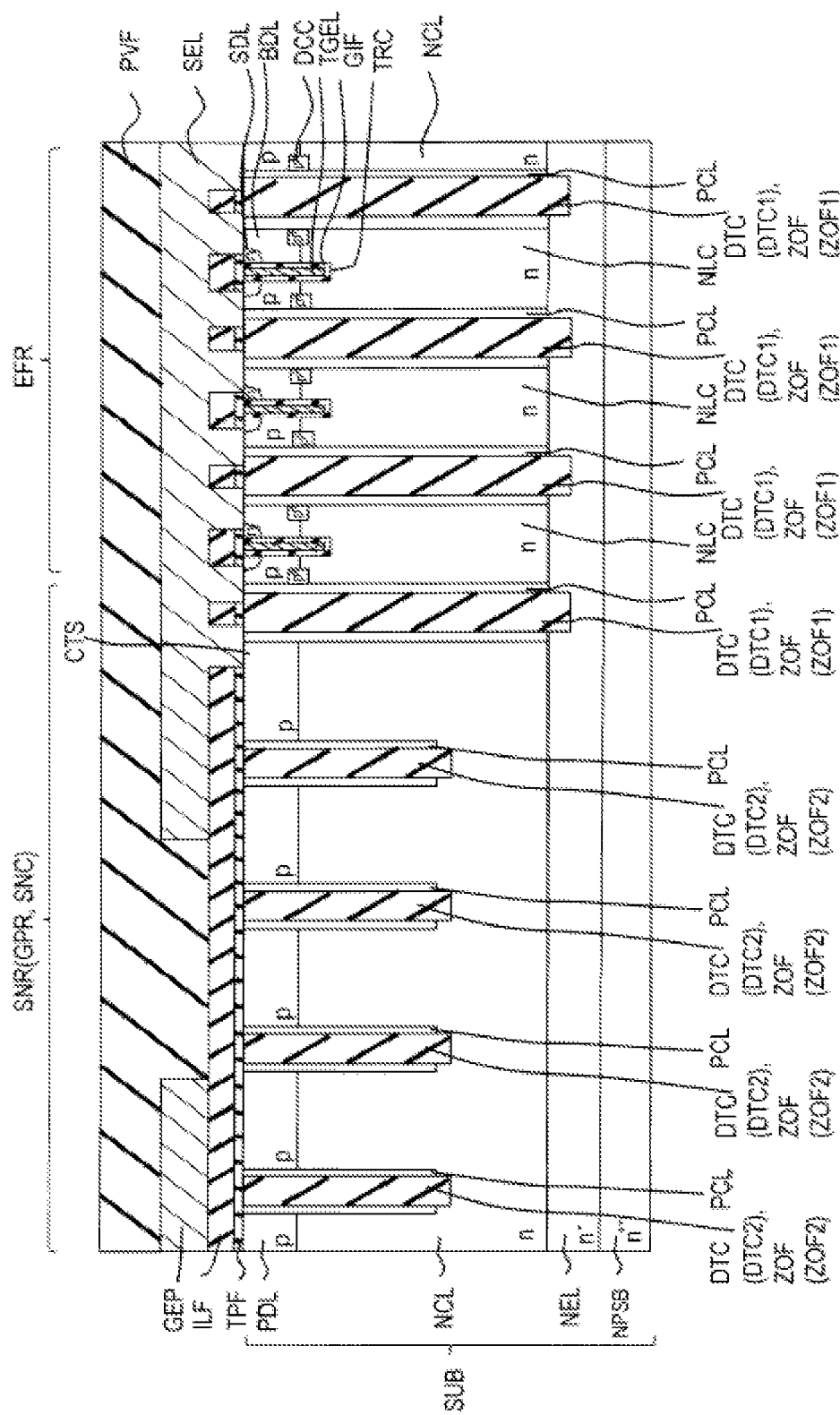
FIG. 15 is a cross-sectional view showing the steps to be performed after the steps shown in FIG. 14 according to first embodiment.

Next, as shown in FIG. 15, so as to cover the source electrode SEL and the gate pad GEP, passivation film PVF is formed. Thereafter, by dicing the scribed area (not shown), a plurality of semiconductor device is taken out as a chip. This completes the main part of semiconductor device PSD.

In the above-described semiconductor device PSD, the region where the insulated gate-type field-effect transistor MFET is not disposed, snubber region SNR is defined, snubber circuit SNC is disposed. It will now be described two functions the snubber circuit SNC has.

The first function is to reduce the generated surge voltage by the snubber circuit SNC. As shown in FIG. 2, the insulated gate-type field-effect transistor MFET originally has a capacitor CDS of parasitic between the source S and the drain D. In semiconductor device PSD described above, for its insulated gate-type field-effect transistor MFET, and additionally, snubber circuit SNCs (capacitor CDS2 and resistor RSNB) are electrically connected.

Figure 16:
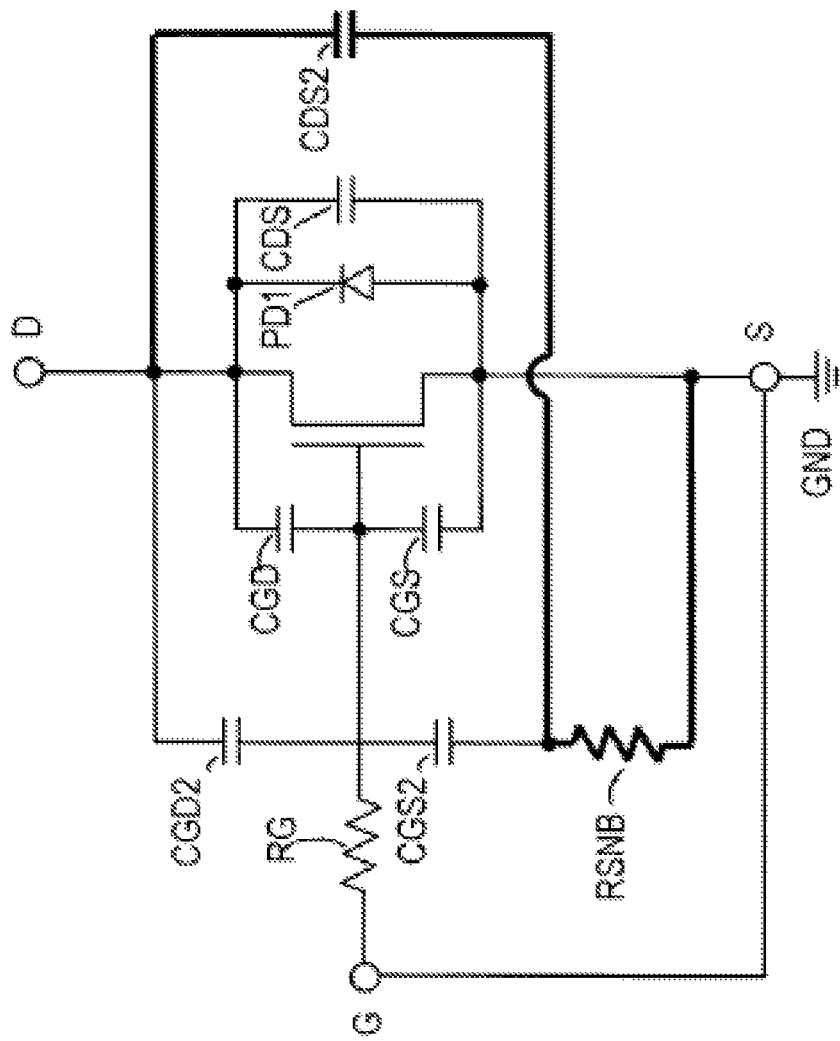
FIG. 16 is a first equivalent circuit diagram for explaining the function of first embodiment according to snubber unit.

Thus, as shown in FIG. 16, when the surge voltage (reverse bias) is generated when the diode PD1 of the parasitic performs recovery operation or the like, the surge voltage, since it is absorbed as energy in the snubber portion SNR, it is possible to reduce the surge voltage (see the thick line in the equivalent circuit diagram). As a result, it is possible to prevent the insulated gate-type field-effect transistor MFET or peripheral semiconductor device (not shown) from being destroyed.

Next, the second function is to reduce the surge voltage by self-turning on the insulated-gate type field-effect transistor MFET by the generated surge voltage. Self-turn-on is a phenomenon in which a voltage (potential difference) is generated between the gate source and the gate is turned on by the capacitance ratio of the parasitic between the drain source.

Figure 17:
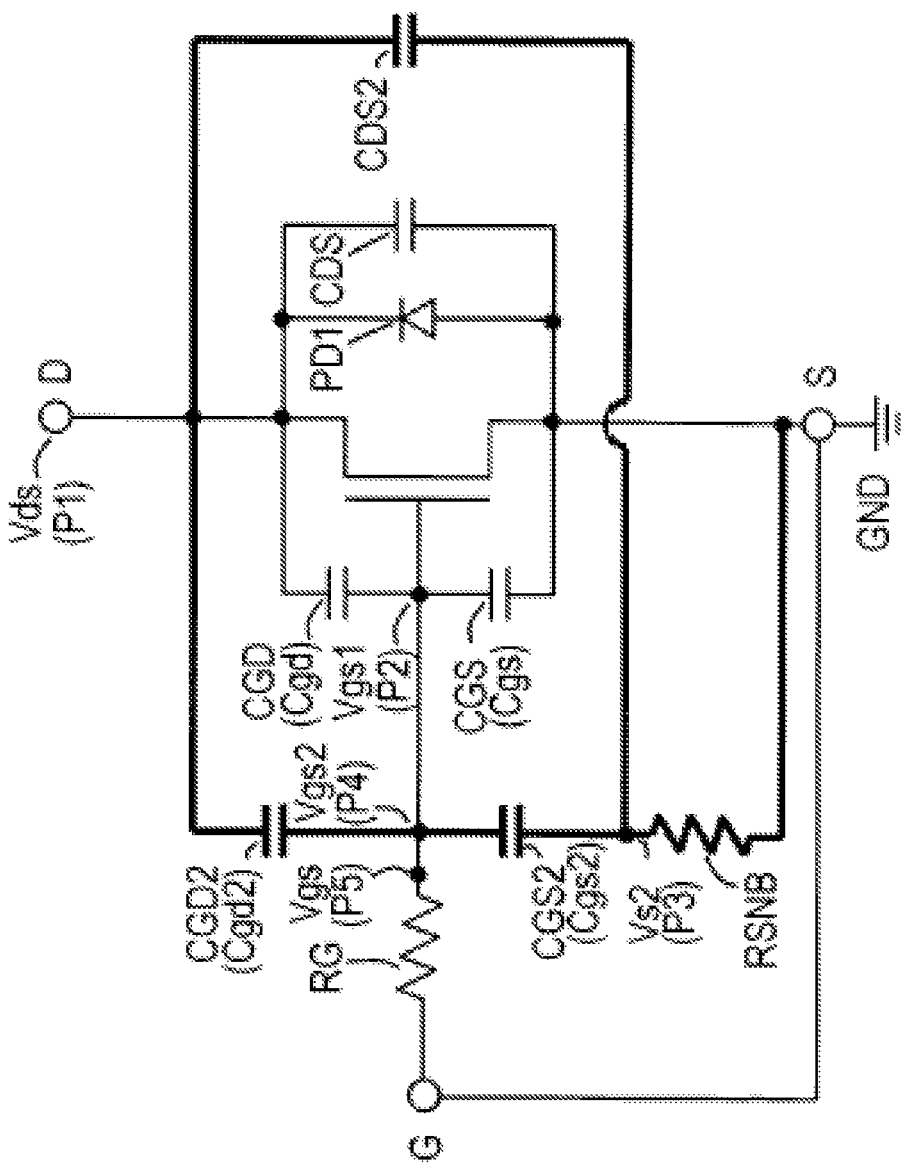
FIG. 17 is a second equivalent circuit diagram for explaining the function of first embodiment according to snubber unit.

Next, as shown in FIG. 17, the voltage applied to the drain (point P1) is taken as a voltage Vds. The voltage generated between the source S and the capacitor CGS (point P2) is taken as the voltage Vgs1. The voltage generated between the source S and the resistor RSNB (point P3) is taken as the voltage Vs2. The voltage generated between the source S and the resistor RSNB and the capacitor CGS (point P4) is taken as the voltage be Vgs. Further, the capacity of capacitor CGS is taken as a capacity Cgs. The capacity of the capacitor CGD is taken as a capacity Cgd. The capacity of the capacitor CGD2 is taken as a capacity Cgd2. The capacity of the capacitor CGS2 is taken as a capacity CGS2.

The voltage Vgs1 is expressed by the following Equation 1.

$$Vgs1=Vds\times(Cgd+Cgd2)/(Cgs+Cgs2+Cgd+Cgd2) \quad \text{(Equation 1)}$$

The voltage Vgs2 is expressed by the following Equation 2.

$$Vgs2=Vs2\times Cgs2/(Cgs+Cgs2) \quad \text{(Equation 2)}$$

The voltage Vgs is expressed by the following Equation 3.

$$Vgs=Vgs1+Vgs2 \quad \text{(Equation 3)}$$

Therefore, if the voltage Vgs is above the threshold voltage Vth of the insulated gate-type field effect transistor MFET (Vgs≥Vth), it is possible to self-turn on the insulated gate-type field effect transistor MFET.

As described above, when the parasitic diode PD1 performs a recovery operation or the like, the parasitic inductance, surge voltages may occur between the source-drain. Here, while the insulated gate-type boundary-effect transistor MFET is off, the drain D, for example, suppose the case of applying a voltage of about 50V. At this time, when the snubber area SNR is not provided semiconductor device (Comparative Example), the inductance of the parasitic, the voltage may rise instantaneously to about 100V. Therefore, by this raised voltage, there is a possibility that the insulated gate type boundary effect transistor or the like is destroyed.

For the comparative example, in semiconductor device PSD described above, by providing the snubber circuit SNC, at the moment the voltage is applied to the drain, it is possible to further generate a voltage Vgs2 between the gate sources (refer to Equation 2). Thus, the voltage Vgs between the gate sources (point P5) (refer to Equation 3) is higher than the voltage between the corresponding gate sources in the case of Comparative Example according to semiconductor device, it is easy to self-turn on the insulated gate type boundary effect transistor MFET.

By the insulated gate-type boundary-effect transistor MFET is self-turned on, the voltage difference between the drain D and the source S is conducted is eliminated, it is possible to suppress the voltage Vds is attempted to increase. An attempt to increase the voltage Vds can be suppressed.

The time for applying the voltage Vgs can be controlled by the capacitance ratio shown in Equations 1 through 3. Therefore, it is possible to limit the current flowing from the drain to the source by turning on, so that the current does not flow too much. That is, by controlling the current flowing from the drain to the source by the voltage Vgs, it is possible to suppress the increase in the voltage of the drain.

In the above-described semiconductor device PSD, snubber region SNR snubber circuit SNC is formed is formed in a region where the insulated gate-type boundary-effect transistor MFET is not formed, where it is defined in the gate pad region GPR. The area of the gate pad region GPR is about several percent of the area of the cell region EFR insulated gate type boundary effect transistor MFET is formed.

Further, for example, by adjusting the length of the snubber region SNR extending in the Y-axis direction (see FIG. 4) or the like, it is possible to form a snubber circuit SNC having an optimum capacitor CDS2 and resistor RSNB to reduce the surge voltage. Furthermore, such snubber circuit SNCs can be formed simultaneously with the step of forming an insulated gate-type boundary-effect transistor MFET in the cell area EFRs with only changing the mask pattern without the addition of additional steps.

Figure 6:
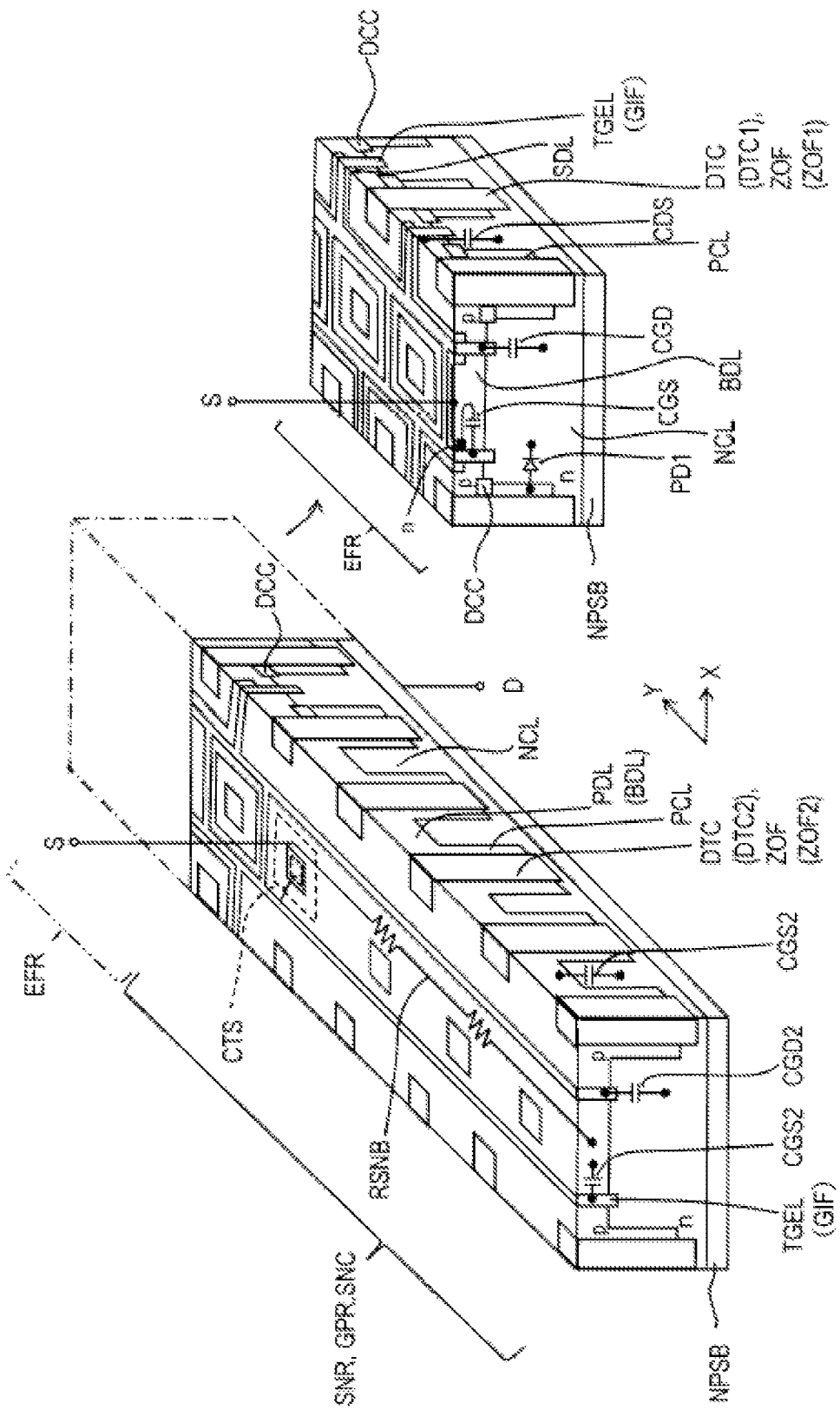
FIG. 6 is a cross-sectional inclined view showing the structure of comparative example according to semiconductor device.

In the above-described semiconductor device PSD, the snubber region SNR has been described as an example when it is defined in the gate pad region GPR, as an area where the insulated gate-type boundary effect transistor MFET is not formed, for example, snubber region SNR, the diode as a temperature sensing element is disposed diode pad region DPR (see FIG. 1) it may be defined. (Comparative Example) Here, in order to explain the features of first embodiment according to semiconductor device PSD, the comparative example according to semiconductor device cPSD will be described. FIG. 6 is a cross-sectional perspective view showing an example of a configuration of a semiconductor device cPSD. Semiconductor device cPSD, the second deep trench DTC2 formed in the snubber region SNR, the width in the plane view of the first deep trench DTC1 formed in the cell region EFR is the same, the depth in the substrate direction is the same.

As shown in FIG. 6, semiconductor device cPSD has the same two effects as the semiconductor device PSD according to first embodiment. Next, the same two effects will be described.

First, the first effect, as shown in FIG. 16, when the surge voltage (reverse bias) is generated when the parasitic diode PD1 performs recovery operation or the like, the surge voltage is absorbed as energy in the snubber portion SNR, it is possible to reduce the surge voltage.

Next, the second effect is that by the generated surge voltage, the insulated-gate type boundary-effect transistor MFET can be self-turned on to reduce the surge voltage. However, the structure of semiconductor device cPSD according to examined has newly created two side-effect problems associated with surge-voltage reduction structures. Next, two problems will be described.

The first problem is that when a voltage is applied between the drain and the source and a breakdown occurs, the withstand voltage waveform vibrates (hereinafter simply referred to as "withstand voltage vibration"). By forming a deep trench DTC1 underneath the gate pad area GPR, the withstand voltage of the device area EFR and the snubber area SNR becomes equal. Therefore, the breakdown current generated in the snubber region SNR rises from the source potential in the P-channel potential just below the gate pad region GPR by passing through the resistor RSNB in the drain-source current path. Thereafter, the junction potential difference just below the gate pad region GPR falls below the breakdown voltage and recovers from the breakdown state. After recovery from the breakdown state, since the current no longer flows, the potential difference between the P-channel potential and the source disappears, and the immediately below the gate pad region GPR breaks down again. As a result, the breakdown states and blocking states are repeated, resulting in a problem that the measured potential is not stable.

Second problem is that the parasitic bipolar malfunctions at the time of avalanche breakdown, and L load tolerance is reduced by latch-up. The drain-source breakdown occurs and the breakdown current generated in the snubber region SNR flows to the source. At this time, in the current path, the parasitic bipolar transistor presents directly below the contact CTS (n-type source diffusion layer SDL is n, the base diffusion layer BDL is p, n-type column layer NCL is n parasitic bipolar transistor) is present. Breakdown current flows in the base portion of the parasitic bipolar transistor, the bipolar transistor parasitic by the voltage drop is malfunctioned, a problem causing L load tolerance decrease by latch-up occurs.

In contrast, in first embodiment according to semiconductor device PSD, at least one width of the deep trench DTC (second deep trench DTC2) formed in the snubber region SNR in a plane view is formed smaller than the deep trench DTC (first deep trench DTC1) formed in the cell region NER. For example, the widths of the deep trenched DTCs (first deep trenched DTC1) formed in the cell region NERs are formed at least 0.5 µm. The second deep trench DTC2 formed in the snubber region SNR may have a width of 0.5 µm or more and a width of 0.7 µm or less. That is, the second deep trench DTC2 has a narrower opening width than the first deep trench DTC1.

Also, at least one depth of the second deep trench DTC2 formed in the snubber region SNR in the depth direction of the substrate is shallower than at least one depth of the first deep trench DTC1 formed in the cell region NER. For example, the depth in the substrate direction of the first deep trench DTC1 is 8 µm or more, the depth in the substrate direction of the second deep trench DTC2 is 6 µm or more and less than 8 µm.

In the second deep trench DTC2 with a narrow opening width, the effective dose to which n-type and p-type impurities are injected is reduced, the region of the depletion layer is widened, and the pressure resistance is improved. Breakdown does not occur just under the gate pad region GPR by improving the withstand voltage immediately below the gate pad region GPR where the snubber region SNR is defined. Since the breakdown occurs in the cell region EFR, the withstand voltage oscillation just below the gate pad region GPR is suppressed.

Further, by improvement of the pressure resistance of the gate pad region GPR snubber region SNR is defined, breakdown is suppressed just below the gate pad region GPR. As a result, to prevent malfunction of the bipolar transistor parasitic, L load tolerance reduction is suppressed.

Second Embodiment

Semiconductor device of this second embodiment is described below with reference to the drawings.

Figure 18:
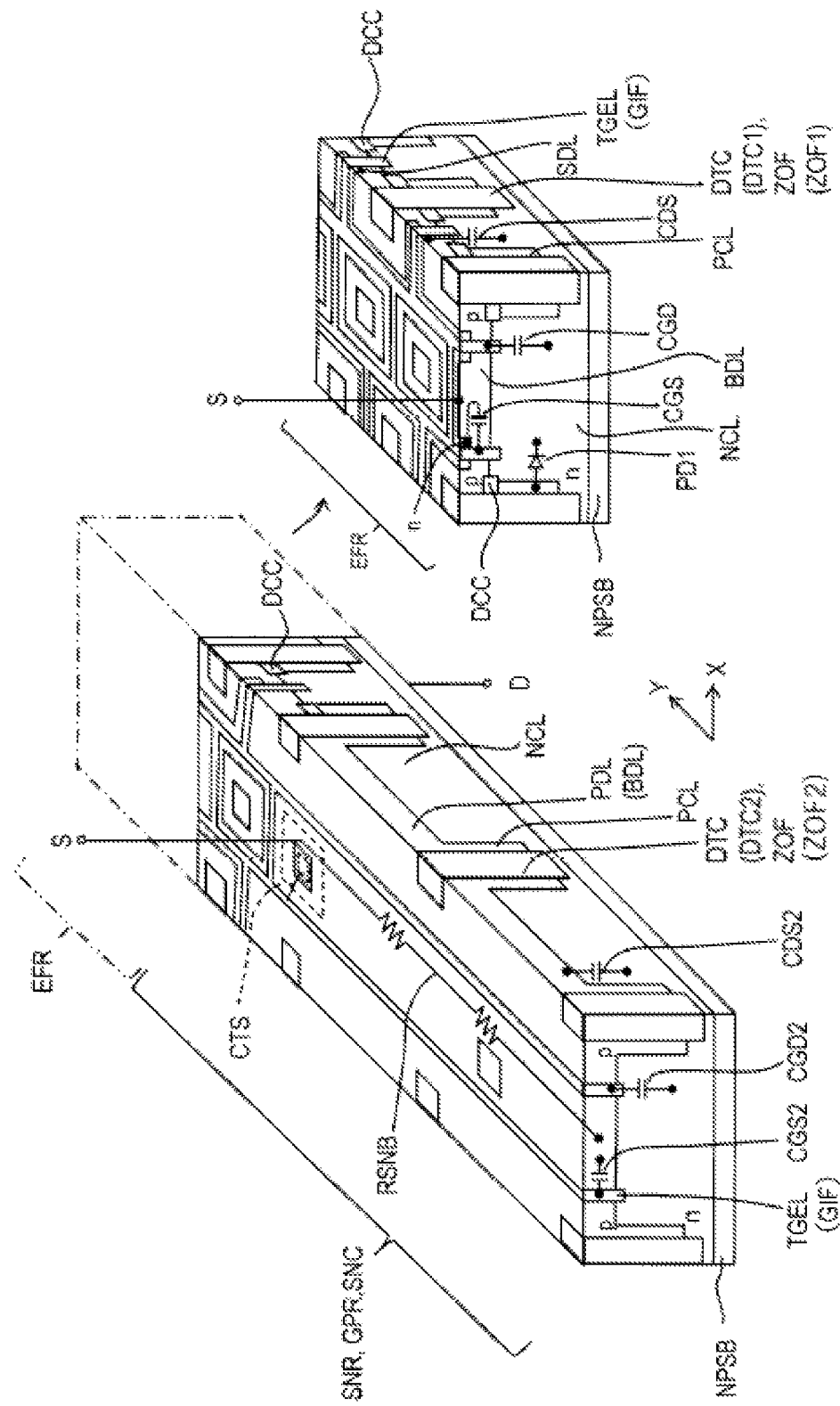
FIG. 18 is a cross-sectional inclined view showing the structures of the corresponding portions in the frame A1 shown in FIG. 1 according to second embodiment.

As shown in FIG. 18, a plurality of second deep trench DTC2 formed in the snubber region SNR is formed so as to extend spaced apart from each other in the X-axis direction, for example, and in the Y-axis direction, to have a pitch wider than the pitch of the plurality of first deep trench DTC1 formed in the cell region NER. For example, the pitch of the plurality of second buried insulator ZOF2 is formed at 2.5 µm or more and 3.0 µm or less. The pitch of the plurality of first deep trench DTC1 is formed, for example, at less than 2.5 µm.

Further, in a plane view, at least one of a plurality of second deep trench DTC2 formed in the snubber region SNR, at least one of a plurality of first deep trench DTC1 formed in the cell region NER is formed in the same width.

Further, in the depth of the substrate, at least one of a plurality of second deep trench DTC2 formed in the snubber region SNR and at least one of a plurality of first deep trench DTC1 formed in the cell region NER are formed at substantially the same depth.

Incidentally, for other configurations, FIG. 3, since the same as the configuration of semiconductor device shown in FIGS. 4 and 5, the same reference numerals are given to the same member, except when it is required, it is intended to not repeat the description.

Next, manufacturing method of above-described semiconductor device will be described. Semiconductor device described above is formed without changing the width and depth of each of a plurality of second deep trench DTC2 formed in the snubber region SNR and a plurality of first deep trench DTC1 formed in the cell area EFR in a series of manufacturing steps of semiconductor device described in first embodiment. Further, the above-described semiconductor device can be formed by the same manufacturing process as first embodiment by simply changing so that the pitch in the Y-axis direction of the second deep trench DTC2 formed in the snubber region SNR is widened.

Thus, in the above-described semiconductor device, as described in first embodiment, by improving the withstand voltage directly below the gate pad region GPR, the breakdown is suppressed directly below the gate pad region GPR snubber region SNR is defined, breakdown in the cell region EFR, the withstand voltage vibration immediately below the gate pad region GPR is suppressed. That is, by forming by widening the pitch of the second deep trench DTC2 directly below the gate pad area GPR, the pressure resistance immediately below the gate pad area GPR is improved, as described above, the pressure resistance vibration is suppressed.

Further, by improvement of the pressure resistance of the gate pad region GPR snubber region SNR is defined, breakdown is suppressed just below the gate pad region GPR. As a result, it prevents malfunction of the bipolar transistor parasitic and L load tolerance reduction is suppressed. That is, by forming by widening the pitch of the second deep trench DTC2 directly below the gate pad area GPR, the withstand voltage immediately below the gate pad area GPR is improved, as described above, L load tolerance reduction is suppressed.

Furthermore, in semiconductor device described above, as described in first embodiment, the surge voltage generated when the parasitic diode PD1 performs recovery operation can be absorbed as energy in the snubber circuit SNC. Further, by the generated surge voltage, the insulated gate-type field-effect transistor MFET is self-turned on, it is possible to reduce the surge voltage.

Third Embodiment

Semiconductor device of this third embodiment is described below with reference to the drawings.

Figure 19:
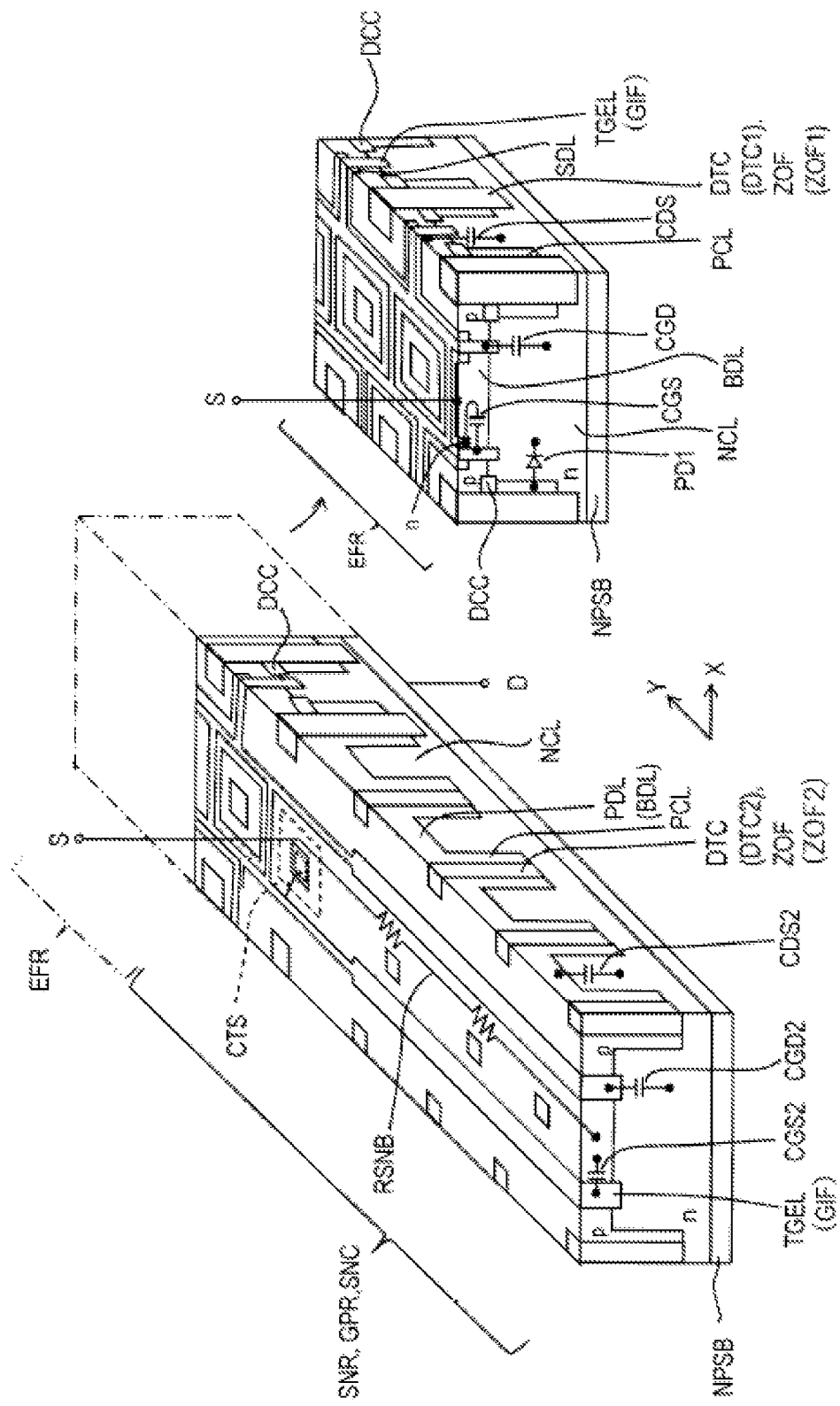
FIG. 19 is a cross-sectional inclined view showing the structures of the corresponding portions in the frame A1 shown in FIG. 1 according to third embodiment.

As shown in FIG. 19, in the snubber region SNR, the trench gate electrode TGEL, for example, while being formed in stripes spaced apart from each other in the Y-axis direction, than the trench gate electrode TGEL formed in the cell region EFR, is formed by widening the width in the X-axis direction. For example, the X-axis widths of the trench gate-electrode TGEL formed in the snubber-region SNRs are between 0.28 μm and 0.9 μm.

Incidentally, for other configurations, FIG. 3, since the same as the configuration of semiconductor device shown in FIGS. 4 and 5, the same reference numerals are given to the same member, except when it is required, it is intended to not repeat the description.

Next, manufacturing method of above-described semiconductor device will be described. Semiconductor device described above can be formed by the same manufacturing process in a series of semiconductor device manufacturing processes described in first embodiment by simply changing the patterns of the trench gate electrode TGEL. That is, in the step of forming the trench gate electrode described above (see FIG. 6), the width of the at least one trench gate electrode TGEL formed in the snubber region SNR is larger than the width of the at least one trench gate electrode TGEL formed in the cell region EFR.

Furthermore, in semiconductor device described above, the surge voltages generated when the parasitic diode PD1 performs the recovery operation can be reduced, as described in first embodiment. Further, by the generated surge voltage, the insulated gate-type field-effect transistor MFET is self-turned on, it is possible to reduce the surge voltage.

In addition to the effects described in first embodiment, above-described semiconductor device has the following effects. Particularly, in the snubber region SNR, the trench gate electrode TGEL is formed by widening the width in the X-axis direction. Thus, the path in which the current flows through the p-type diffusion layer PDL is narrowed, the resistance of the resistor RSNB is higher. By increasing the resistance value in the snubber circuit SNC, it becomes possible to further reduce the surge voltage. Further, in proportion to the width of the X-axis, the gate-drain capacitor CGD2 is increased because the insulated gate-type field-effect transistor MFET is deeper with respect to the substrate direction in the Y-axis direction. This makes it easier to self-turn on the insulated-gate field-effect transistor MFET, thus enabling further reduction of surge voltages.

Incidentally, the snubber circuit or the like of semiconductor device described in the embodiments can be combined various as required.

Although the invention made by the present inventor has been specifically described based on the embodiment, the present invention is not limited to the embodiment described above, and it is needless to say that various modifications can be made without departing from the gist thereof.

What is claimed is:

1. A semiconductor device comprising:
   a semiconductor substrate having a first major surface and a second major surface opposite to the first major surface;
   an insulated gate field-effect transistor disposed in a first region of the semiconductor substrate; and
   a snubber circuit disposed in a second region other than the first region;
   wherein the snubber circuit includes a resistor and a capacitor formed of a diffused layer in the second region;
   wherein a plurality of first trenches spaced apart from each other in a plane view are formed in the first region;
   wherein a plurality of second trenches spaced apart from each other in a plane view are formed in the second region;
   wherein each of the plurality of first trenches has a first width;
   wherein each of the plurality of second trenches has a second width; and wherein the second width of at least one of the second trenches is smaller than the first width of at least one of the first trenches in the plurality of first trenches.

2. The semiconductor device according to claim 1, wherein the second trench has a width of 0.5 μm or more and less than 0.7 μm in a plane view.

3. The semiconductor device according to claim 1, wherein the plurality of first trenches formed in the first region are deeper trenches than trench gate electrodes formed in semiconductor substrate.

4. The semiconductor device according to claim 1, wherein the plurality of second trenches formed in the second region are deeper trenches than trench gate electrodes formed in semiconductor substrate.

* * * * *